US008445950B2

(12) United States Patent
Iida et al.

(10) Patent No.: US 8,445,950 B2
(45) Date of Patent: May 21, 2013

(54) SOLID-STATE IMAGING DEVICE

(75) Inventors: Yoshinori Iida, Tokyo (JP); Risako Ueno, Tokyo (JP); Kazuhiro Suzuki, Tokyo (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 261 days.

(21) Appl. No.: 12/875,546

(22) Filed: Sep. 3, 2010

(65) Prior Publication Data
US 2011/0156186 A1    Jun. 30, 2011

(30) Foreign Application Priority Data

Dec. 28, 2009  (JP) ................................. 2009-297658

(51) Int. Cl.
*H01L 31/062* (2012.01)
(52) U.S. Cl.
USPC .................... 257/292; 257/432; 257/E31.127
(58) Field of Classification Search
USPC ................................................ 257/292, 294
See application file for complete search history.

(56) References Cited

U.S. PATENT DOCUMENTS

| 7,265,402 | B2 * | 9/2007 | Koyanagi | 257/292 |
|---|---|---|---|---|
| 8,034,649 | B2 * | 10/2011 | Oshiyama et al. | 438/48 |
| 8,101,450 | B1 * | 1/2012 | Doan et al. | 438/57 |
| 8,120,081 | B2 * | 2/2012 | Murakoshi | 257/294 |
| 2004/0089914 | A1 * | 5/2004 | Mouli et al. | 257/510 |
| 2005/0179053 | A1 * | 8/2005 | Ezaki et al. | 257/189 |
| 2005/0184353 | A1 * | 8/2005 | Mouli | 257/446 |
| 2008/0083939 | A1 * | 4/2008 | Guidash | 257/292 |
| 2008/0290436 | A1 * | 11/2008 | Amicis | 257/432 |
| 2010/0117126 | A1 * | 5/2010 | Takahashi | 257/292 |
| 2012/0153127 | A1 * | 6/2012 | Hirigoyen et al. | 250/208.1 |

FOREIGN PATENT DOCUMENTS

| JP | 5-283516 | 10/1993 |
|---|---|---|
| JP | 5-283520 | 10/1993 |
| JP | 7-254652 | 10/1995 |
| JP | 2006-120804 | 5/2006 |
| JP | 2008-306160 | 12/2008 |
| JP | 2009-522814 | 6/2009 |
| JP | 2009-206356 | 9/2009 |
| WO | WO 2007/081881 A1 | 7/2007 |

OTHER PUBLICATIONS

U.S. Appl. No. 12/875,534, filed Sep. 3 2010, Ueno, et al.

(Continued)

*Primary Examiner* — Benjamin Sandvik
(74) *Attorney, Agent, or Firm* — Oblon, Spivak, McClelland, Maier & Neustadt, L.L.P.

(57) ABSTRACT

Certain embodiments provide a solid-state imaging device including: a plurality of pixels provided on a semiconductor substrate, each of the pixels having a semiconductor region that converts incident light from a side of a first face of the semiconductor substrate into signal charges and stores the signal charges; a readout circuit provided on a side of a second face that is the opposite side from the first face, and reading out the signal charges stored in the pixels; and a pixel separation structure provided between adjacent ones of the pixels in the semiconductor substrate, the pixel separation structure including a stack film buried in a trench extending from the first face, the stack film including a first insulating film provided along side faces and a bottom face of the trench, and a fixed charge film provided in the trench to cover the first insulating film and retaining fixed charges that are non-signal charges.

9 Claims, 18 Drawing Sheets

OTHER PUBLICATIONS

Japanese Office Action issued Jan. 20, 2012 in patent application No. 2009-297658 with English translation.

Japanese Office Action issued Sep. 25, 2012, in Japan patent application No. 2009-297658 (with English translation).

* cited by examiner

SOLID-STATE IMAGING DEVICE

CROSS-REFERENCE TO RELATED APPLICATION

This application is based upon and claims the benefit of priority from prior Japanese Patent Application No. 2009-297658 filed on Dec. 28, 2009 in Japan, the entire contents of which are incorporated herein by reference.

FIELD

Embodiments described herein relate to a solid-state imaging device.

BACKGROUND

In recent years, pixel sizes are rapidly becoming smaller, in response to demands for solid-state imaging elements that are smaller in size and include a larger number of pixels. Particularly, since there is a need to satisfy the demands for smaller camera modules and camera modules with a larger number of pixels, there are strong demands for finer pixels in the imaging elements for portable telephone devices with camera functions.

However, as pixels become finer, the tendency of the S/N ratio to be lower becomes inevitable. The noises generated in the photodiodes in the pixels can be divided into the components that are generated in proportion to their volumes, and the components that are generated in the interface between each photodiode and its peripheral structures. However, it is well known that the latter is the dominant components. Also, it is known that, of the components generated in the interface between each photodiode and its peripheral structures, the pixel separation face components or the components that are proportional to the product of the peripheral length of the photodiode and the depth of the photodiode observed when the photodiode is cut along a plane perpendicular to incident light are the dominant components. Only the noises in the pixel separation face components are proportional to the pixel pitch, and the other noises and signal amounts are proportional to the square of the pixel pitch. Accordingly, when only the inside of each photodiode is taken into consideration, the noises in the pixel separation face components relatively increase, and the S/N ratio becomes lower, as the pixels become finer.

In reality, most of the noise components outside the photodiodes are not affected directly by the reduction in size of pixels. However, there are noise components that increase as the pixels become finer, such as the noises in analog transistors in the pixels. Even if the noises in the pixel separation face components can be ignored, and the S/N ratio inside the photodiodes does not depend on the pixel pitch, the S/N ratio becomes lower as the pixels become finer.

To reduce the pixel separation face component noises that become dominant at the time of miniaturization of pixels, the separation structure of each photodiode or a so-called pixel separation structure has an impurity separation structure unique to solid-state imaging elements, and differs from a device separation structure of a general miniaturized LSI.

A device separation structure of a miniaturized LSI is normally a trench separation structure that has an oxide film buried in a trench structure. When this trench separation structure is applied to pixel separations in a solid-state imaging element, the dark current generated from the interface state between Si and $SiO_2$ existing in the sidewalls of the trench separation structure generates large noises, and causes the S/N ratio to rapidly deteriorate. It is known that, to avoid the influence of the interface state between Si and $SiO_2$, a high-density $p^+$-type impurity diffused region is effectively formed in the sidewalls of the trench.

However, it is not necessarily easy to form such a high-density $p^+$-impurity region. Furthermore, a trench separation and the formation of a high-density $p^+$-type impurity diffused region around a trench lead to an increase in pixel serration area occupancy, and hinder miniaturization of pixels.

Also, it is known that there is a trade-off relationship between the width and depth of each pixel separation structure. Therefore, in fine pixels each having an impurity separation structure, there is the problem of a decrease in the volume of each photodiode due to a relative increase in pixel separation width, or a decrease in the depth of each pixel separation structure and a decrease in the depth of each photodiode.

When the depths of pixel separations and photodiodes become smaller, the amount of long-wavelength light that can be absorbed becomes smaller, and the signal amount also becomes smaller. The charges generated due to light absorption in regions deeper than the pixel separations and the photodiodes enter adjacent pixels, and so-called electrical crosstalk occurs. Although it is apparent that the former causes the S/N ratio to become lower, the latter not only lowers the spatial resolution but also lowers the S/N ratio.

Electrical crosstalk also occurs for some reasons other than the depths of pixel separations and photodiodes. Electrical crosstalk occurs in a case where the signal charges generated inside a photodiode enter adjacent pixels via a pixel separation structure. To form a high-density $p^+$-impurity region that is a general pixel separation structure among solid-state imaging elements, it is necessary to perform low-acceleration to high-acceleration ion implantation several times. However, in a case where the depth of the bottom of the profile of injected and activated impurities or the height of the potential barrier in the portion having a low impurity density in the depth direction is not sufficiently large, electrical crosstalk might occur through that portion. To prevent the crosstalk, it is necessary to perform ion implantation many times at various acceleration voltages, and simplification of the manufacturing procedures is hindered. The electrical crosstalk through the pixel separation is formed with the components that are proportional to the pixel pitch, and the ratio of electrical crosstalk to the signal components that are proportional to the square of the pixel pitch tends to become higher as the pixels become finer.

Furthermore, it is important to restrain not only the electrical crosstalk but also optical crosstalk. In the peripheral portions of the imaging region, incident light enters the substrate not in a vertical direction but in an oblique direction. Particularly, in a solid-state imaging element for portable telephone devices with camera functions that have small-sized, low-height camera modules, the maximum incidence angle is large. The light that enters in an oblique direction cuts across a photodiode cross section obliquely. As a result, the components that are not sufficiently absorbed inside the photodiode pass through the photodiode, and reach the pixel separation structure. The main component of a high-density $p^+$-impurity region that is a standard pixel separation structure among solid-state imaging elements is single-crystal silicon that is a semiconductor substrate material. When optically observed, there is not a boundary with the photodiode region, and the transmitted light that has reached the pixel separation region travels straight ahead. Further, the components that are not absorbed in the pixel separation region pass through the pixel separation region, and reach an adjacent photodiode. The components are then absorbed in the adjacent photodiode, and optical crosstalk occurs.

To restrain occurrences of optical crosstalk, a separation with a trench in which a material to reflect incident light is buried is effectively performed.

When the pixel separation with a trench structure is applied to a solid-state imaging element, it is necessary to form an additional high-density $p^+$-type impurity diffused region for restraining generation of dark current, and as a result, the photodiode aperture size is restricted.

In a structure that does not require a high-density $p^+$-type impurity diffused region, a conductive material buried in a trench structure is biased at a negative voltage, to form a hole storage layer in the vicinity of the boundary face between a photodiode and a pixel separation structure. In this manner, noises of pixel separation face components can be reduced.

However, when a negative voltage is applied to a conductive material buried in a trench structure, an electric field is always formed in the insulating material formed between the conductive material and the photodiode. If there is a defect in the insulating material, a local electric field concentration occurs, and a leakage current generated by the breakdown flows into the photodiode. As a result, defects such as white scars in an image might be caused. Furthermore, it is necessary to add a structure for applying the negative voltage.

As a technique for avoiding a decrease in the amount of incident light entering a photodiode due to a pixel-region metal interconnect layer that is another cause of a decrease in the S/N ratio in miniaturization of pixels, so-called back-illuminated solid-state imaging elements that have light entering from the back face side of a semiconductor substrate, which is the opposite side from the metal interconnect layer, are being actively developed.

After incident light passes through the microlenses and color filter array of such a back-illuminated solid-state imaging element, the light does not pass through the metal interconnect layer but directly enters the photodiodes. Accordingly, high light use efficiency is achieved, and the sensitivity becomes higher.

Also, as the distance that incident light travels to reach a silicon substrate is shortened, obliquely incident light is refracted when entering the silicon substrate having a high refractive index. Accordingly, this structure is also effective against optical crosstalk.

However, where the pixel pitch is reduced to approximately 1 µm, the depth of each photodiode is approximately 3 µm. Therefore, obliquely incident light reaches adjacent pixels, and optical crosstalk still occurs.

To achieve sufficiently high red sensitivity, the depth of each photodiode should preferably be 5 µm or greater. With such a depth, however, the above-mentioned optical crosstalk increases, or it is difficult to form a high-density $p^+$-type impurity diffusion region at a deep location. For such reasons, the thickness of the silicon substrate in each back-illuminated solid-state imaging element is approximately 3 µM, and sufficiently high red sensitivity is not achieved.

As described above, to restrain a decrease in the S/N ratio (sensitivity) in the course of miniaturization of pixels, it is essential to reduce the noise components generated in the vicinity of each photodiode, and reduce optical crosstalk and electrical crosstalk.

To do so, pixel separation structures that can be formed in a very small size and can be formed at sufficiently deep locations are needed, so as not to compress the volumes of photodiodes. Particularly, to reduce optical crosstalk, trench-type pixel separation structures are desired.

With trench-type pixel separation structures, however, the structures necessary for reducing noises of pixel separation components compress the volumes of photodiodes, or cause white scars, or the like.

DETAILED DESCRIPTION

Certain embodiments provide a solid-state imaging device including: a semiconductor substrate of a first conductivity type, including a first face, a second face being opposite to the first face, and a trench extending from the first face into the semiconductor substrate; a plurality of pixels provided in the semiconductor substrate, each of the pixels having a semiconductor region of a second conductivity type that converts incident light from the first face of the semiconductor substrate into signal charges and stores the signal charges; a readout circuit provided on a side of the second face of the semiconductor substrate, and reading out the signal charges stored in the pixels; and a pixel separation structure provided between adjacent ones of the pixels in the semiconductor substrate, the pixel separation structure including a stack film that is buried in the trench in the semiconductor substrate, the stack film including a first insulating film provided along side faces and a bottom face of the trench, and a fixed charge film provided in the trench to cover the first insulating film and retains fixed charges that are non-signal charges.

Hereafter, solid-state imaging devices according to the present invention will be described more specifically with reference to the drawings.

First Embodiment

Figure 1:
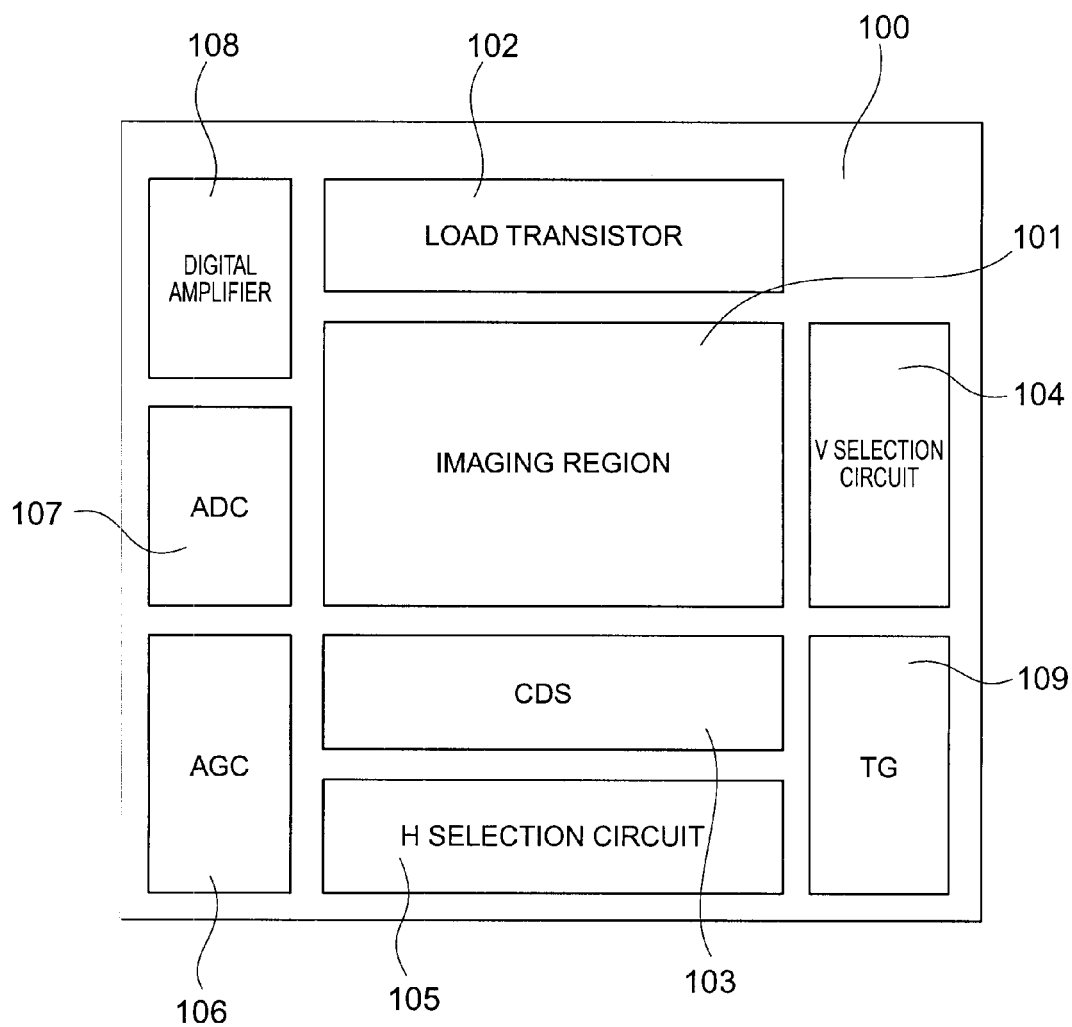
FIG. 1 is a plan view of a solid-state imaging device according to a first embodiment.

FIG. 1 shows a solid-state imaging device according to a first embodiment. The solid-state imaging device 100 according to this embodiment includes photoelectric conversion pixels 200 that are arranged in a matrix fashion in an imaging region 101. The photoelectric conversion pixels 200 convert incident light signals into electrical signals through photoelectric conversions. A load transistor unit 102, a CDS (Correlated Double Sampling) circuit unit 103, a Vertical selection circuit 104, a Horizontal selection circuit 105, an AGC (automatic gain control) circuit 106, an ADC (A-D converter) 107, a digital amplifier 108, a TG (timing generator) circuit 109, and the likes are provided to surround the imaging region 101. The ADC 107 is integrally formed with the CDS circuit 103, and can be formed as a column-type CDS-ADC circuit structure. Alternatively, the TG circuit 109, the AGC circuit 106, the ADC 107, the digital amplifier 108, and the likes may be formed on a separate chip.

Figure 2:
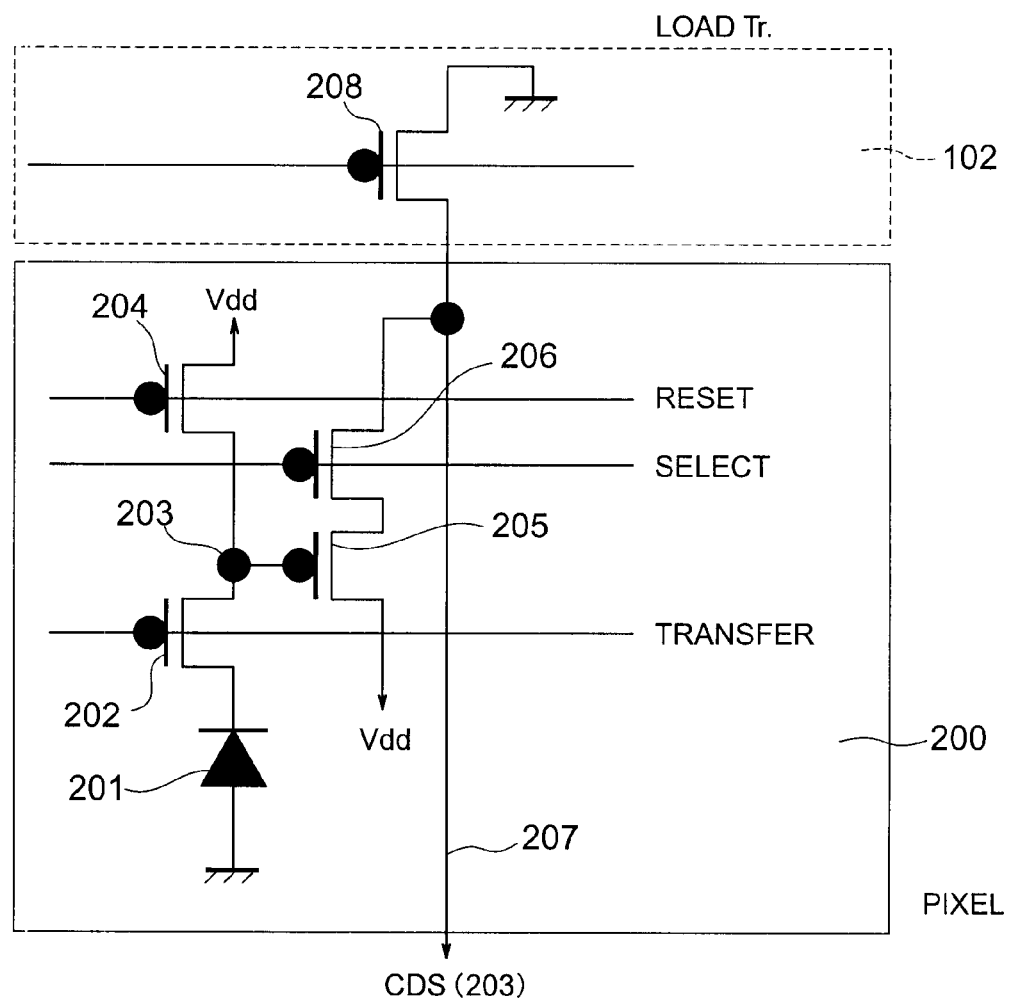
FIG. 2 is a circuit diagram of a pixel of the solid-state imaging device according to the first embodiment.

FIG. 2 shows the inner circuit structure of one of the pixels 200 forming the imaging region 101. In FIG. 2, the portion surrounded by a solid line on the lower side is the circuit structure of the pixel 200. A photodiode that performs photoelectric conversions is connected to a floating diffusion layer 203 via a transfer transistor 202. The floating diffusion layer 203 is formed with a high-density n$^+$-type impurity diffused region, for example, and is connected to Vdd via a reset transistor 204 that resets the floating diffusion layer 203. The floating diffusion layer 203 is connected to the gate of an amplifier transistor 205. The drain of the amplifier transistor 205 is connected to a drive voltage Vdd, and the source of the amplifier transistor 205 is connected to a vertical signal line 207 via a select transistor 206. One end of the vertical signal line 207 is connected to the ground via a load transistor 208 that is surrounded by a broken line in the upper portion of FIG. 2 and is located outside the imaging region 101. The other end of the vertical signal line 207 is connected to the CDS circuit 103 (see FIG. 1) located outside the imaging region 101. The load transistor 208 and the amplifier transistor 205 that are connected in series via the vertical signal line 207 constitute a source-follower circuit, and output a signal voltage generated in the floating diffusion layer 203 to the CDS circuit 103.

In FIG. 2, the unit pixel 200 has all the functions for photoelectric conversions, signal charge storage, charge-voltage conversions, and formation of the source-follower circuit. However, two or more photodiodes 201 and transfer transistors 202 may be connected to a single floating diffusion layer 203 as needed, so as to share the other components forming the circuit in the pixel, such as the floating diffusion layer 203, the reset transistor 204, the amplifier transistor 205, and the select transistor 206. In other words, miniaturization of the pixels 200 can be more easily realized by forming two pixels with one cell, or forming four pixels with one cell. In the structure shown in FIG. 2, the positions of the amplifier transistor 205 and the select transistor 206 may be switched.

Figure 3:
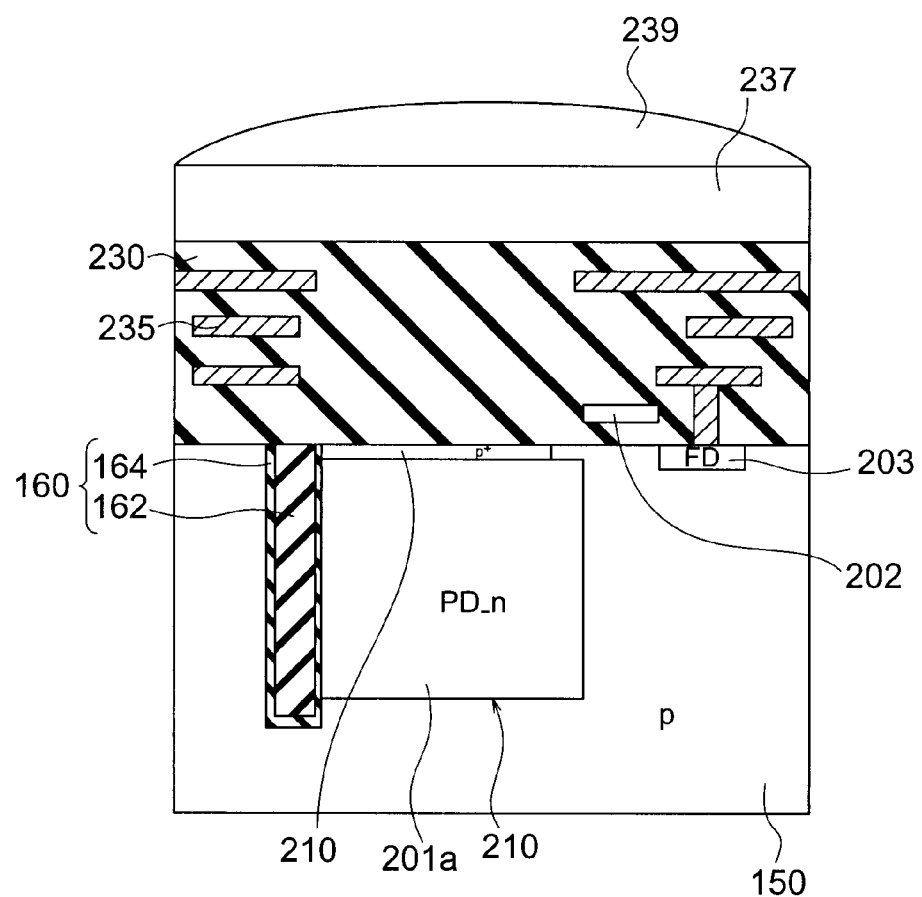
FIG. 3 is a cross-sectional view of a pixel of the solid-state imaging device according to the first embodiment.

FIG. 3 shows a cross-section structure of the solid-state imaging device according to the first embodiment. An n-type impurity region (hereinafter also referred to as a PD_n-region) 201a forming the photodiode 201 is formed in a p-type silicon substrate 150. Signal electrons generated through photoelectric conversions in the photodiode 201 having a pn junction formed with the PD_n-region 201a and the p-type semiconductor substrate 150 are stored in the PD_n-region 201a. When the transfer transistor 202 formed in the silicon substrate 150 is switched on, the signal electrons are transferred to the floating diffusion layer 203. The floating diffusion layer 203 and the amplifier transistor 205 (see FIG. 2) to which the gate of the floating diffusion layer 203 is connected are modulated, so that signals in accordance with the amount of incident light are read out. The transfer transistor 202 and the amplifier transistor 205 are covered with an interlayer insulating film 230, and metal interconnect layers 235 connected to those transistors or the floating diffusion layer 203 are formed in the interlayer insulating film 230. A color filter 237 is provided on the interlayer insulating film 230, and a microlens 239 is provided on the color filter 237. A p$^+$-type impurity diffused region 210 is provided on the portion of the semiconductor substrate 150 between the PD_n-type region 201a and the interlayer insulating film 230, so as to prevent dark current from flowing into the PD_n-region 201a. A constant potential (0 V, for example) is applied to this p$^+$-type impurity diffused region 210.

The PD_n-region 201a has a so-called buried photodiode structure, being completely buried inside the silicon substrate 150 for lower noise. A trench-type pixel separation structure 160 is provided as a pixel separation structure for element separation from adjacent pixels. This pixel separation structure 160 has a fixed charge film 162 buried in a trench formed in the silicon substrate 150. The fixed charge film 162 retains fixed charges. A silicon oxide layer 164 of an extremely small thickness equivalent to several atomic layers is provided between the fixed charge film 162 and the trench. The silicon oxide layer 164 is provided along the side faces and the bottom face of the trench. Therefore, the pixel separation structure 160 is designed to include the fixed charge film 162 and the silicon oxide layer 164. As the fixed charge film 162, an oxide dielectric film containing at least one element selected from the group consisting of hafnium (Hf), zirconium (Zr), and titanium (Ti) is used, for example. Where a hafnium oxide is used, it is possible to bury the hafnium oxide film by ALD (Atomic Layer Deposition) using TDEAH (Tetrakis-DiEthylAmino-Hafnium) as a raw material.

Since signal charges are electrons in this embodiment, the fixed charge film 162 retains negative charges, to form a hole storage region in the vicinity of the pixel separation structure 160 on the side of the PD_n-region 201a or in the vicinity of the interface between the fixed charge film 162 and the silicon oxide layer 164 on the side of the PD_n-region 201a. Specifically, after a hafnium oxide film is formed by ALD, annealing is performed in a hydrochloric acid atmosphere, to terminate the dangling bonds of hafnium atoms existing in the interface between the hafnium oxide film and the silicon oxide layer with chlorine atoms. In this manner, negative fixed charges are formed and can be retained. At this point, the fixed charge area density is adjusted to $1.0 \times 10^{12}$ cm$^{-2}$ or higher, so that a sufficient hole storage layer is formed in the vicinity of the interface, and generation of dark current is restrained. Also, the fixed charge area density is adjusted to $1.0 \times 10^{13}$ cm$^{-2}$ or higher, so that the dark current can be reduced in a more stable manner, which is more preferable.

According to this embodiment, even if obliquely incident light directed toward the photodiode 201 reaches the pixel separation structure 160, the light is reflected and does not enter the adjacent pixels. This is because the refractive index of each of the silicon oxide layer 164 and the hafnium oxide film is lower than the refractive index of silicon. In other words, this is because, where $n_1$ represents the refractive index of silicon (=3.9), and $n_2$ represents the refractive index of silicon oxide (=1.4) or the refractive index of hafnium oxide (=2.0), the light that enters at a smaller angle than the critical angle θc defined by the following equation (1) is total-reflected:

$$\theta c = \arcsin(n_2/n_1) \qquad (1)$$

Accordingly, optical crosstalk is remarkably reduced. At this point, the pixel separation structure 160 has a so-called tapered shape, with the aperture size of its bottom face being smaller than the aperture size of its light incidence side. With this arrangement, the incident light enters the pixel separation structure 160 at a smaller angle, and the optical crosstalk can be reduced over a wider range, which is more preferable.

Further, with the pixel separation structure 160, a deeper pixel separation can be formed. Accordingly, the sensitivity to red is made higher, and electrical crosstalk is also remarkably reduced. The problems with conventional arts are also solved. This will be described in the following.

First, as the structure to reduce the noise generated in the vicinity of the interface that separates pixels, the fixed charge film 162 buried inside the pixel separation structure 160 is used to make a high-density p$^+$-type impurity diffused region unnecessary. A high-density p$^+$-type impurity diffused region is essential in conventional arts, and is formed next to a trench-type pixel separation layer. With the high-density p$^+$-type impurity diffused region being unnecessary, the volume of the PD_n-region is not compressed, and at the same time, the open aperture of each photodiode does not become smaller. Accordingly, a decrease in sensitivity due to the pixel separation structure is not caused.

Furthermore, even if there is a defect existing in the silicon oxide layer 164 between the fixed charge film 162 and the silicon substrate 150, charges are not injected from the fixed charge film 162, and white scars are not formed.

As described above, according to this embodiment, the pixel separation structure 160 performs pixel separations. Accordingly, a solid-state imaging device that has less optical crosstalk and less electrical crosstalk can be obtained.

Electrons are used as signal charges in this embodiment. However, in a case where holes are used as signal charges, an electron storage layer is formed in the vicinity of the interface by retaining positive charges in the fixed charge film 162. In that case, the same effects as above can be achieved. In a case where a hafnium oxide film is used as the fixed charge film 162, for example, the fixed charge film 162 can be formed by the above described ALD, and the dangling bonds of the hafnium atoms existing in the interface between the hafnium oxide and the silicon oxide layer retain positive charges.

(First Modification)

Figure 4:
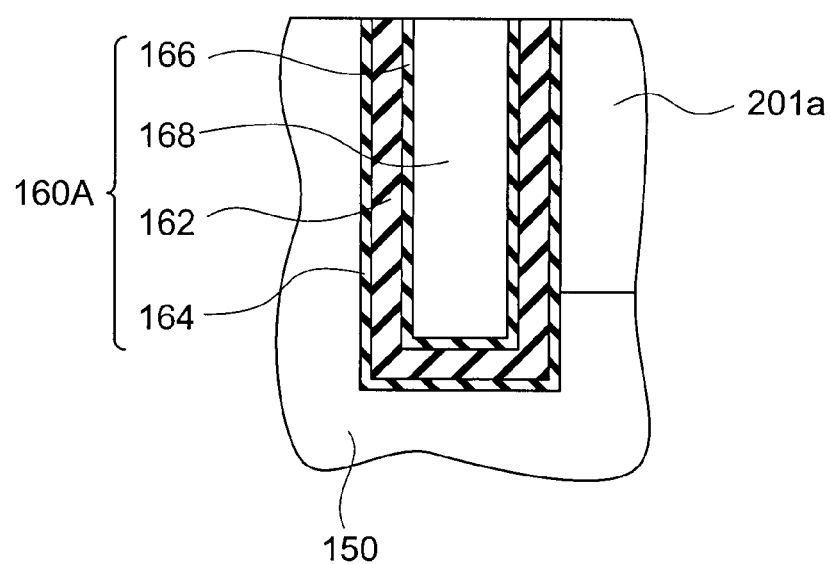
FIG. 4 is a cross-sectional view of a pixel separation structure according to a first modification of the first embodiment.

Referring now to FIG. 4, a solid-state imaging device according to a first modification of the first embodiment is described. The solid-state imaging device of the first modification differs from the solid-state imaging device of the first embodiment in that the trench-type pixel separation structure 160 is replaced with a trench-type pixel separation structure 160A shown in FIG. 4. The pixel separation structure 160A according to the first modification has a structure in which stacked films of a silicon oxide layer 164, a charge fixed film 162 formed with a silicon nitride film, a silicon oxide layer 166, and a polycrystalline silicon film 168 are formed in this order inside a trench. This pixel separation structure 160A can achieve the same effects as those of the first embodiment. Here, the silicon oxide layer 166 applies a voltage of 10 to 20 V to the polycrystalline silicon film 168, so as to adjust the film thickness to approximately 2 nm, which allows a tunnel current to flow. The silicon nitride film 162 has such a composition as to retain fixed charges inside. For example, the silicon nitride film 162 has a silicon-rich composition such as $Si_9N_{10}$, and its film thickness is approximately 10 nm. The silicon oxide layer 164 has a film thickness of approximately 2 nm, for example, so as to form a hole storage layer inside the silicon substrate 150.

In the pixel separation structure 160A of the first modification, such a voltage as to allow a tunnel current to flow in the silicon oxide layer 166 is applied to the polycrystalline silicon film 168 buried in the trench structure, so that electrons can be injected from the polycrystalline silicon film 168 into the silicon nitride film 162. The electrons injected into the silicon nitride film 162 are trapped, and fixed charges can be obtained.

According to this modification, the same effects as those of the first embodiment are achieved, and a highly-sensitive solid-state imaging device that has less optical crosstalk and less electrical crosstalk can be obtained.

Furthermore, the above-described procedure to form fixed charges inside the silicon nitride film 162 may be carried out during the device manufacture or immediately after the device manufacture, to achieve a sufficient effect. After that, there is no need to apply a voltage to the polycrystalline silicon film 168. Also, since the above described stack structure formed with the silicon oxide layer 164, the silicon nitride film 162, and the silicon oxide layer 166 is formed between the polycrystalline silicon film 168 and the semiconductor substrate 150, the probability of formation of white scars due to a gate leak becomes remarkably lower.

Second Embodiment

Figure 5:
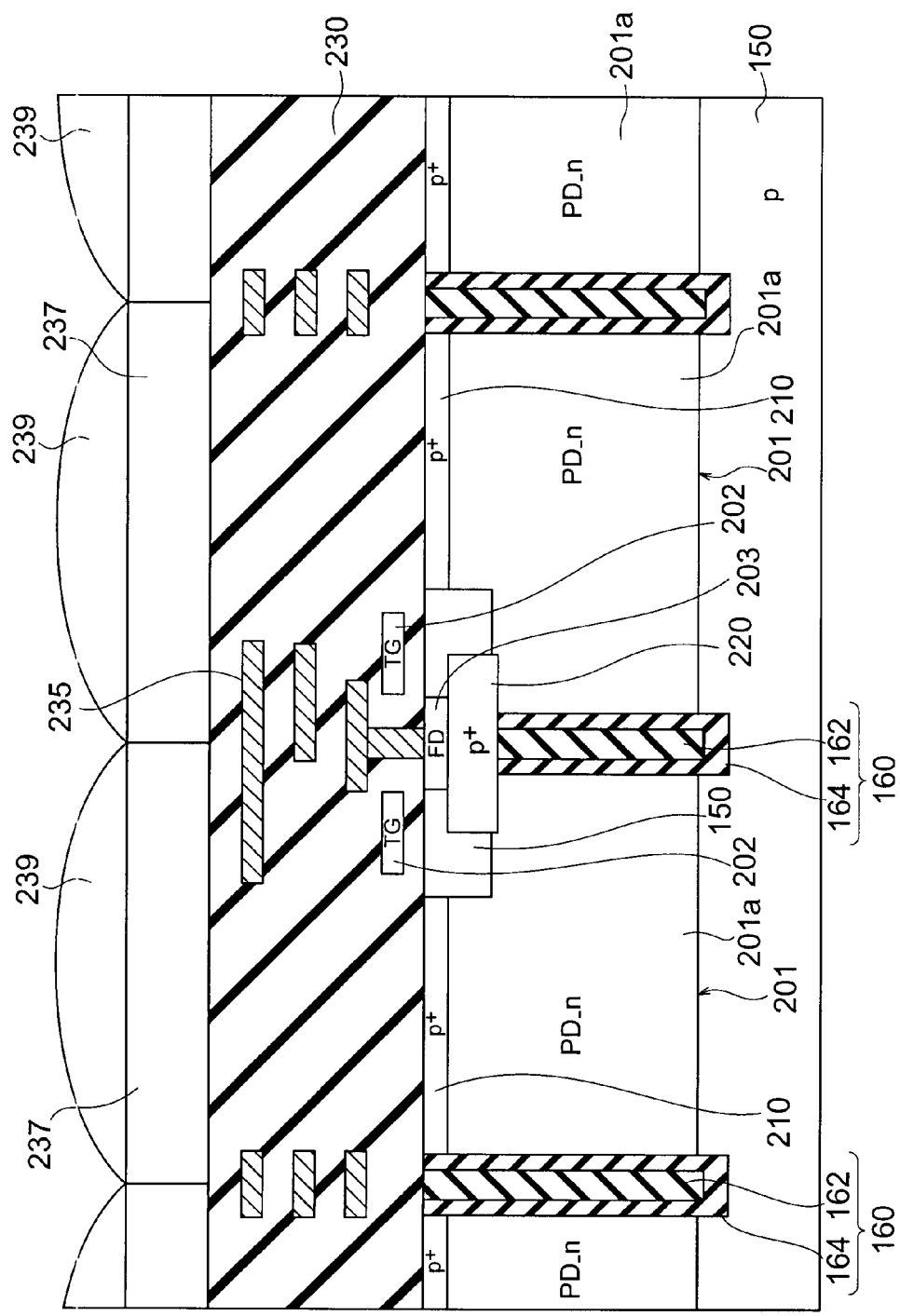
FIG. 5 is a cross-sectional view of a solid-state imaging device according to a second embodiment.

FIG. 5 shows a solid-state imaging device according to a second embodiment. Like the solid-state imaging device of the first embodiment, the solid-state imaging device of the second embodiment has a trench-type pixel separation structure 160 provided between adjacent pixels, and a p$^+$-pixel separation region 220 is provided between each floating diffusion layer 203 and the corresponding pixel separation structure 160 on the sides on which the floating diffusion layers 203 are provided between adjacent pixels. The p$^+$-type pixel separation regions 220 are not provided on different sides from the sides on which the floating diffusion layers 203 are provided between adjacent pixels. In this second embodiment, each pixel separation structure 160 has a silicon oxide layer 164 and a fixed charge film 162 containing hafnium oxide that are buried in a trench formed in a semiconductor substrate 150, as described with reference to FIG. 3. In FIG. 5, a p$^+$-type impurity diffused region 210 for preventing dark current from flowing into each PD_n-region 201a is provided on each PD_n-region 201a. A color filter 237 provided on each pixel is placed so that its color is different from that of the color filter placed on each adjacent pixel.

According to this embodiment, the above described pixel-circuit sharing method can be implemented. Specifically, in a case where pixels are laid out in a pixel-circuit sharing manner, the two photodiodes sharing one floating diffusion layer 203 are formed by arranging a photodiode 201, a transfer transistor 202, a floating diffusion layer 203, a transfer transistor 202, and a photodiode 201 in this order on the surface of the silicon substrate 150 on the wiring side. Inside the silicon substrate 150, however, a photodiode 201, a p$^+$-type pixel separation region 220, and a photodiode 201 are formed and arranged in this order. In this case, each pixel separation structure 160 for separating pixels between two photodiodes 201 is buried inside the silicon substrate 150, and each p$^+$-type pixel separation region 220 formed with a high-density p+-type impurity diffused region in contact with the wiring-side end face of the corresponding pixel separation structure 160 is formed. A transfer transistor 202, a floating diffusion layer 203, and a transfer transistor 202 are further formed on the front face side of the silicon substrate 150, to obtain the separated structure illustrated in FIG. 5.

Next, an example of the method for manufacturing the separated structure illustrated in FIG. 5 is described.

First, the pixel separation structures 160 are formed in the silicon substrate 150. Etching of a desired depth is then performed on portions of the pixel separation structures 160, with the portions corresponding to the regions in which the high-density p+-pixel separation regions 220 are to be formed. Concave portions are formed at the etched portions of the pixel separation structures 160. Through an epitaxial growth, the concave portions are filled with a single-crystal silicon film. At this point, planarization is performed on the surface of the silicon substrate 150 as needed.

After that, according to the regular procedures for manufacturing a solid-state imaging device, the p+-type pixel separation regions 220, the floating diffusion layers 203, and the transfer transistor 202 are formed. Further, the interlayer insulating film 230, metal interconnect layers 235, the color filters 237, and the microlenses 239 are formed.

In this embodiment, each p+-type pixel separation region 220 exists in a region inside the silicon substrate 150 located below the region on which a transfer transistor 202, a floating diffusion layer 203, and a transfer transistor 202 are provided. In this embodiment, however, the p+-type pixel separation regions 220 are formed in a sufficiently shallow region, compared with a conventional structure in which each entire pixel separation structure is formed with a p+-type pixel separation region. Therefore, there is not a problem in terms of fine processing, and electrical crosstalk can be sufficiently reduced. At the same time, light leakage from obliquely incident light into adjacent pixels that causes optical crosstalk can be remarkably reduced.

According to this embodiment, a pixel layout according to the pixel-circuit sharing method can be used, and finer pixels can be obtained. Also, combined with the high sensitivity characteristically achieved by the pixel-circuit sharing method, a solid-state imaging device with higher sensitivity can be obtained.

(First Modification)

Figure 6:
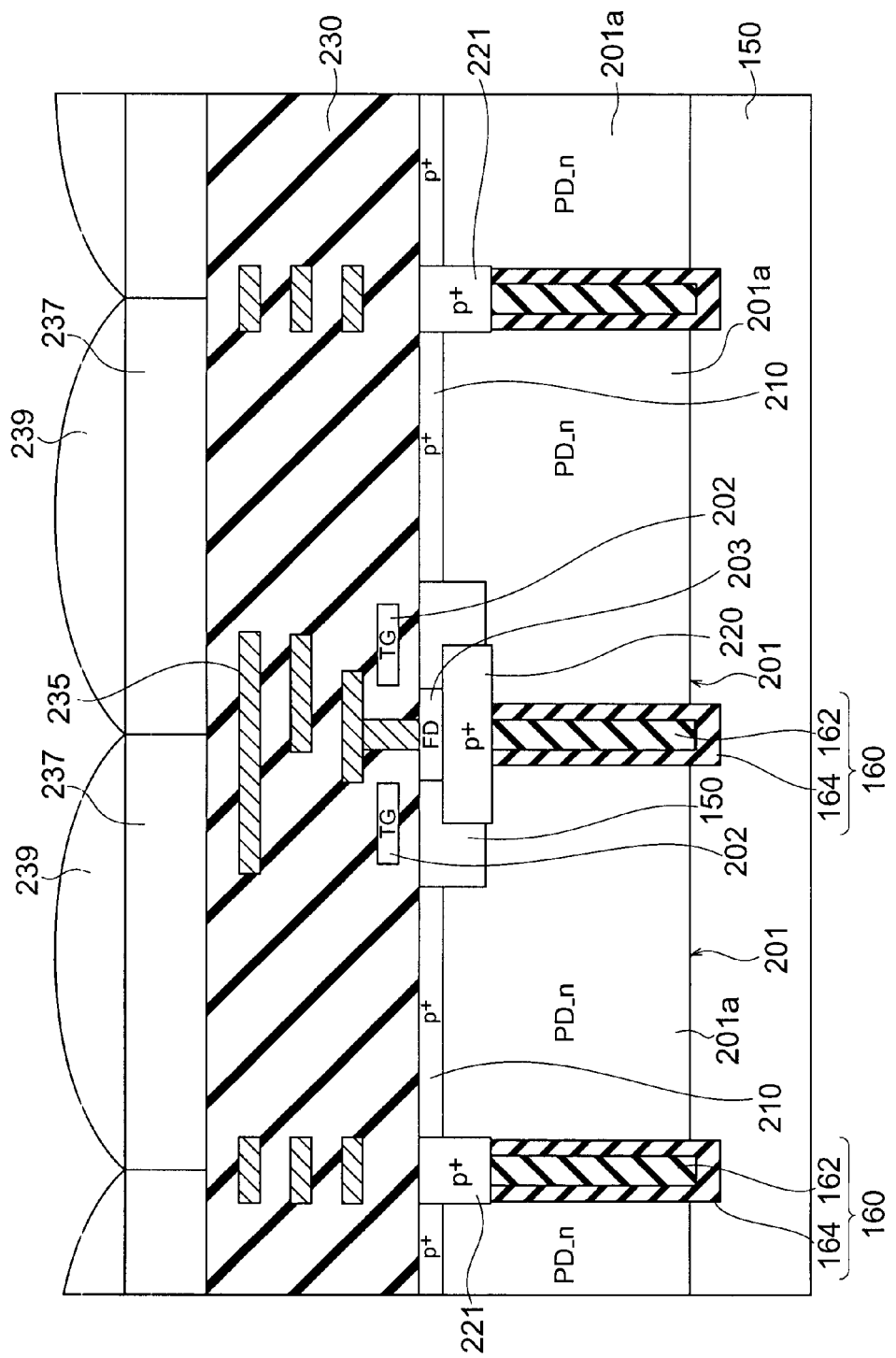
FIG. 6 is a cross-sectional view of a solid-state imaging device according to a first modification of the second embodiment.

FIG. 6 shows a solid-state imaging device according to a first modification of the second embodiment. The solid-state imaging device of the first modification differs from the solid-state imaging device illustrated in FIG. 5 in that p+-type pixel separation regions 221 are provided on pixel separation structures 160 on the different sides from the sides on which floating diffusion layers 203 between adjacent pixels are provided. Specifically, between adjacent pixels, a pixel separation structure 160 and a p+-type pixel separation region 220 or 221 are provided. As in this first modification, all the pixel separation structures on the front face side of the silicon substrate 150 between the adjacent pixels may have a structure that includes a p+-type pixel separation region 220 or 221 and a pixel separation structure 160 provided below this p+-type pixel separation region 220 or 221.

To obtain the pixel separation structure according to this first modification, the same procedures as the manufacturing procedures described in the second embodiment are carried out.

This first modification can achieve the same effects as those of the second embodiment, and a pixel layout according to the pixel-circuit sharing method can be used to achieve finer pixels. Also, combined with the high sensitivity characteristically provided by the pixel-circuit sharing method, a solid-state imaging device with higher sensitivity can be obtained.

(Second Modification)

Figure 7:
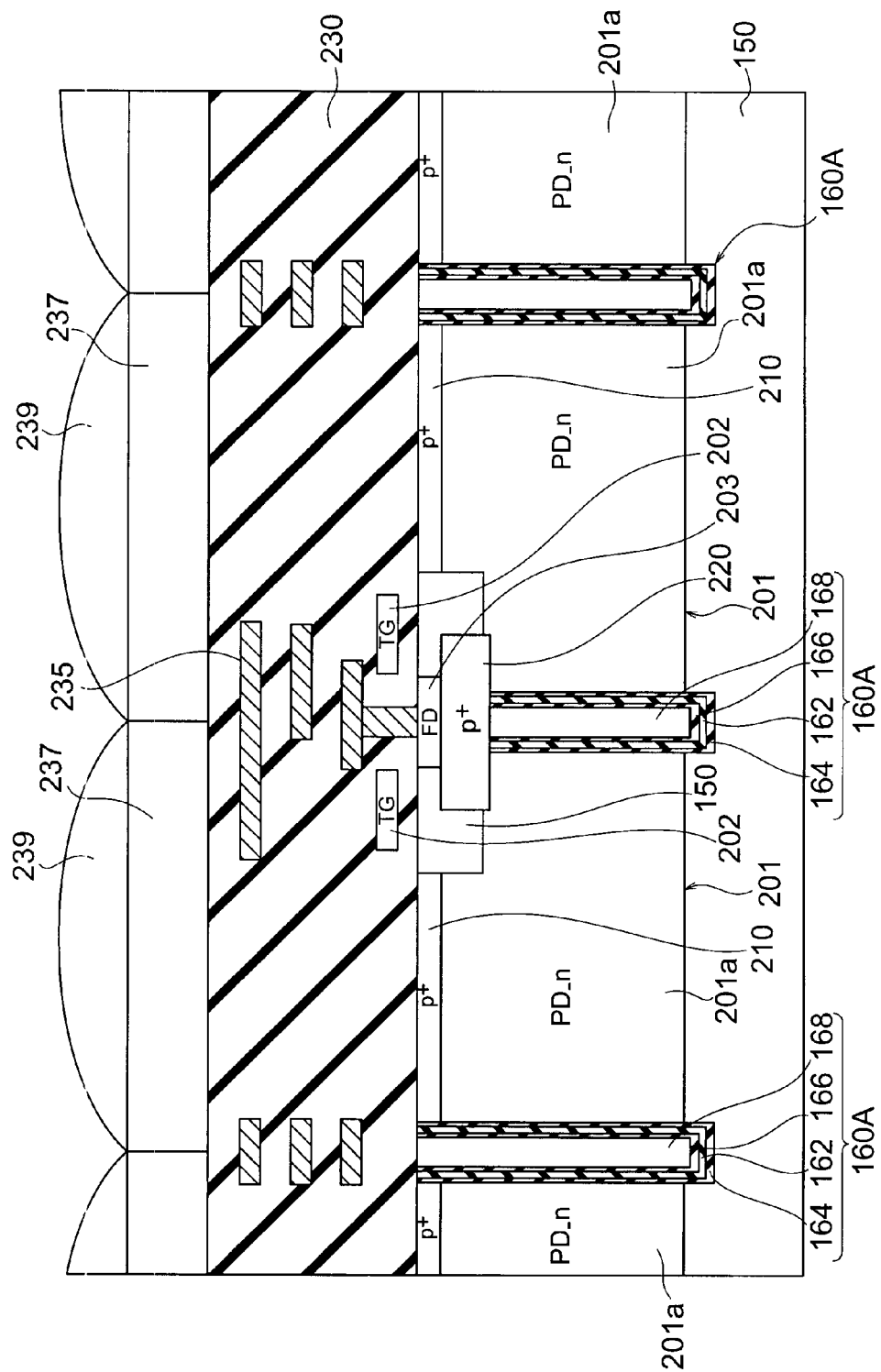
FIG. 7 is a cross-sectional view of a solid-state imaging device according to a second modification of the second embodiment.

FIG. 7 shows a solid-state imaging device according to a second modification of the second embodiment. The solid-state imaging device of the second modification differs from the solid-state imaging device illustrated in FIG. 5 in that each trench-type pixel separation structure 160 is replaced with the trench-type pixel separation structure 160A shown in FIG. 4.

The solid-state imaging device of the second modification can also achieve the same effects as those of the second embodiment.

Also, a highly sensitive solid-state imaging device that has less optical crosstalk and less electrical crosstalk can be obtained.

Furthermore, the above-described procedure to form fixed charges inside each silicon nitride film 162 may be carried out during the device manufacture or immediately after the device manufacture, to achieve sufficient effects. After that, there is no need to apply a voltage to the polycrystalline silicon films 168. Also, since the above described stack structure formed with a silicon oxide layer 164, a silicon nitride layer 162, and a silicon oxide layer 166 is formed between each polycrystalline silicon film 168 and the semiconductor substrate 150, the probability of formation of white scars due to a gate leak becomes remarkably lower.

(Third Modification)

Figure 8:
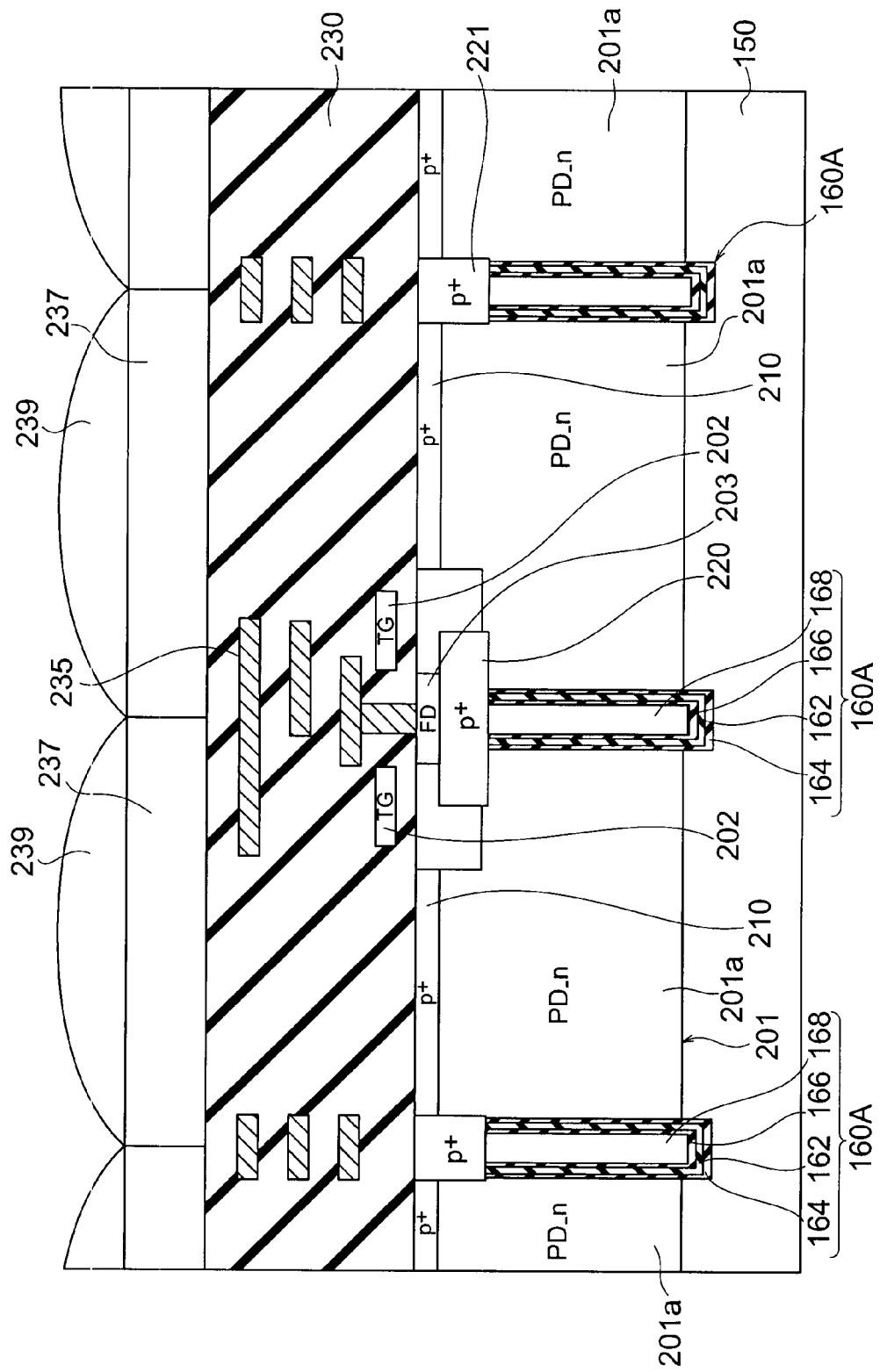
FIG. 8 is a cross-sectional view of a solid-state imaging device according to a third modification of the second embodiment.

FIG. 8 shows a solid-state imaging device according to a third modification of the second embodiment. The solid-state imaging device of the third modification differs from the solid-state imaging device of the first modification illustrated in FIG. 6 in that each trench-type pixel separation structure 160 is replaced with the trench-type pixel separation structure 160A shown in FIG. 4.

The solid-state imaging device of the third modification can also achieve the same effects as those of the first modification of the second embodiment.

Also, a highly-sensitive solid-state imaging device that has less optical crosstalk and less electrical crosstalk can be obtained.

Furthermore, the above-described procedure to form fixed charges inside each silicon nitride film 162 may be carried out during the device manufacture or immediately after the device manufacture, to achieve sufficient effects. After that, there is no need to apply a voltage to the polycrystalline silicon films 168. Also, since the above described stack structure formed with a silicon oxide layer 164, a silicon nitride layer 162, and a silicon oxide layer 166 is formed between each polycrystalline silicon film 168 and the semiconductor substrate 150, the probability of formation of white scars due to a gate leak becomes remarkably lower.

Third Embodiment

Figure 9:
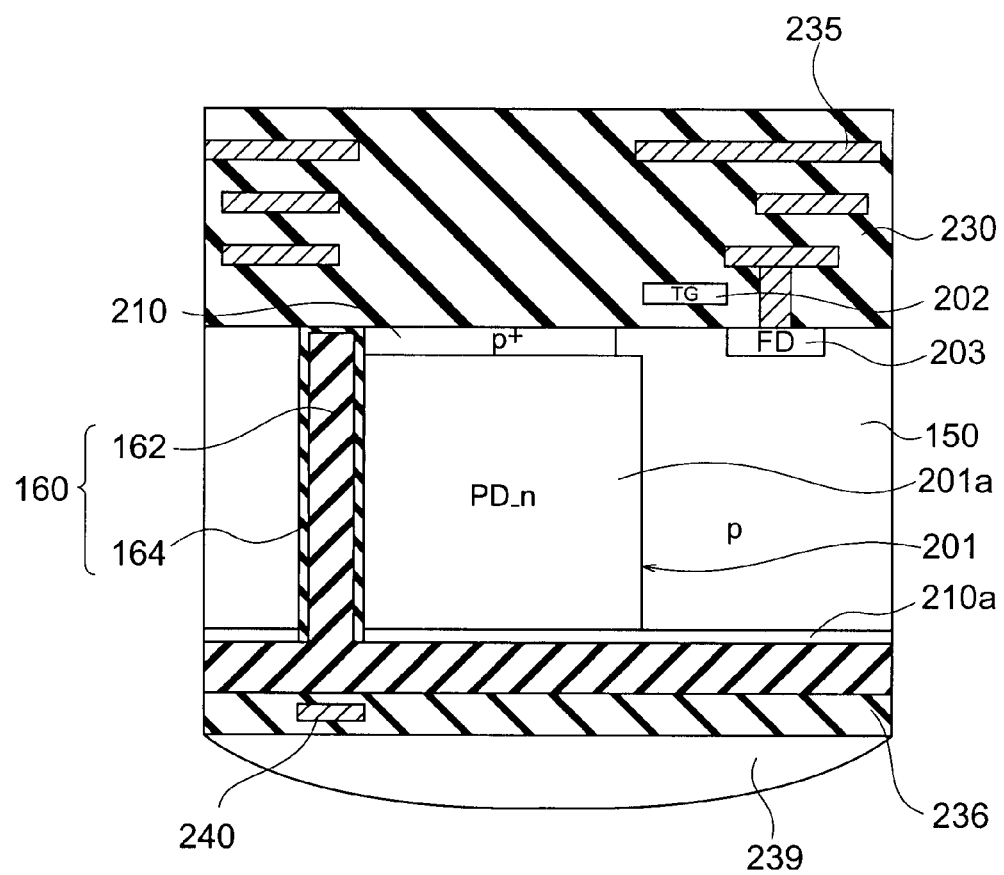
FIG. 9 is a cross-sectional view of a solid-state imaging device according to a third embodiment.

FIG. 9 shows a solid-state imaging device according to a third embodiment. Each of the solid-state imaging devices according to the first and second embodiments and their modifications is a front-illuminated solid-state imaging device. Incident light enters a front-illuminated solid-state imaging device from the front face side. On the other hand, the solid-state imaging device of the third embodiment is of a back-illuminated type.

In this solid-state imaging device of the third embodiment, each trench-type pixel separation structure 160 is provided between adjacent pixels in a silicon substrate 150 in which photodiodes 201 each having a PD_n-region 201a are formed. This pixel separation structure 160 has a trench that penetrates through the silicon substrate 150 from the back face side to the front face side. A silicon oxide layer 164 and a fixed charge film 162 made of a dielectric oxide are buried in the trench. In other words, this pixel separation structure 160 has the same structure as each pixel separation structure 160 described in the first and second embodiments and their modifications.

Also, as described in the first and second embodiments, a transfer transistor 202, a floating diffusion layer 203, a reset transistor (not shown), and an amplifier transistor (not shown) are provided on the front face side of the silicon substrate 150. Further, an interlayer insulating film 230 is provided on the front face of the silicon substrate 150, and metal interconnect layers 235 are provided in the interlayer insulating film 230. The different aspects from the first embodiment are that the fixed charge film 162 is provided on the back face side of the silicon substrate 150, and an insulating film 236 that transmits incident light is provided on the fixed charge film 162 (below the fixed charge film 162 in the drawing). A microlens 239 is provided on the insulating film 236 (below the insulating film 236 in the drawing). In the region of the insulating film 236 corresponding to the pixel separation structure 160, a light shield 240 is provided to overlap with or cover the pixel separation structure 160. A $p^+$-type impurity diffused region 210 for preventing dark current from flowing into a PD_n-region 201a is provided in a region on the front face side of the silicon substrate 150 between the PD_n-region 201a and the interlayer insulating film 230. A $p^+$-type impurity diffused region 210a for preventing dark current from flowing into the PD_n-region 201a is provided in a region on the back face side of the silicon substrate 150 between the PD_n-region 201a and the fixed charge film 162. Since a constant potential is applied to the fixed charge film 162, the $p^+$-type impurity diffused region 210a may not be required in this embodiment.

A method for manufacturing the solid-state imaging device of the third embodiment is as follows.

According to the procedures for manufacturing a conventional back-illuminated solid-state imaging device, the structure on the side of the metal interconnect layers 235 is completed on the silicon substrate 150. After that, the structure is bonded to a supporting substrate (not shown). Polishing or the like is then performed on the light incidence side face of the silicon substrate 150, to process the silicon substrate 150 into a structure of a desired thickness and remove the damaged layer from the surface of the silicon substrate 150.

A trench extending from the light incidence side is then formed, and a fixed charge film is formed in the trench. For example, the silicon oxide layer 164 and the hafnium oxide film 162 to be the fixed charge film are formed in this order. When the silicon oxide layer 164 and the hafnium oxide film 162 are buried in the trench, the fixed charge film 162 is also formed on the surface of the silicon substrate 150 on the light incidence side. At this point, the fixed charge film 162 can be formed at such a low temperature that hardly damages the metal interconnect layers 235 and the portions in contact with the metal interconnect layers 235. Accordingly, the fixed charge film 162 can also be formed to extend from the back face side.

After that, according to the procedures for manufacturing a conventional back-illuminated solid-state imaging device, an insulating film layer, the light shield 240 for preventing light from entering between pixels, the insulating film 236, and the microlens 239 are formed to obtain the structure illustrated in FIG. 9.

According to this embodiment, combined with the high-sensitivity effect that is characteristic of a back-illuminated solid-state imaging device, a solid-state imaging device with higher fineness and higher sensitivity can be obtained.

The refractive index of the hafnium oxide as the fixed charge film is 2.0, which is a value close to the square root of the product of the refractive index of single-crystal silicon as the silicon substrate, which is 3.9, and the refractive index of the air, which is 1. By taking advantage of this aspect, an antireflection structure for incident light can be formed, and such a structure is more preferable. Where $d_1$ represents the film thickness required for an antireflection structure, and $d_2$ represents the film thickness required for burying a pixel separation structure, it is ideal that $d_1$ and $d_2$ are equal to each other ($d_1 = d_2$). However, even if $d_1$ and $d_2$ are not equal to each other ($d_1 \neq d_2$), appropriate processing can be performed.

If $d_1$ is larger than $d_2$ ($d_1 > d_2$), the film thickness on the light incidence face side is still insufficient even when the filling of the pixel separation structure 160 is completed. In such a case, after the filling of the trench portion is completed, film formation is performed on the trench region at the same speed as the film formation on the light incidence face. Strictly speaking, the portion on the trench region has such a thickness that a slightly concave portion is formed, as opposed to the flat portion on the incidence face side. However, this does not cause a problem, as the light shield 240 is formed in that region.

If $d_1$ is smaller than $d_2$ ($d_1 < d_2$), the filling of the inside of the pixel separation structure 160 has not been completed when the film thickness of the light incidence face side becomes sufficiently large. In that case, the following two types of measures can be taken.

According to one of the two types of measures, the film formation is further continued, and the film thickness $d_2$ necessary for the filling is achieved. After that, a so-called etchback process is carried out to perform etching on the entire surface, so that the film thickness of the flat portion becomes $d_1$. Strictly speaking, the portion located on the trench has such a thickness that a slightly concave portion is formed, as opposed to the flat portion on the incidence face side. However, this does not cause a problem, as the light shield 240 is formed in that region.

According to the other one of the two types of measures, the film formation is ended when the film thickness of the flat portion on the light incidence face side becomes $d_1$, and the inside of the trench is then filled with some other material. In this case, etchback can be performed on the last filling material as needed. The last filling material may be a silicon oxide film having a refractive index of 1.4, which is between the refractive index of the hafnium oxide, which is 2.0, and the refractive index of the air, which is 1.0, for example. By taking advantage of this relationship in refractive index, a greater effect can be achieved from the antireflection structure, which is more preferable. Also, by taking this measure, a structure according to the later described fourth embodiment is obtained. Accordingly, optical crosstalk is further reduced, and higher sensitivity can be achieved.

Furthermore, since a trench-type pixel separation structure is formed also on the back face side, a different effect is also achieved, and even higher sensitivity can be achieved. This is because the alignment precision during the lithography processing becomes higher when the light shield 240 is formed, and the optical aperture improves as will be described below.

The light shield 240 prevents optical crosstalk before light enters the silicon substrate 150, by shielding each region between photodiodes from light emitted between pixels. Therefore, it is necessary to establish and control the positional relationship with the PD_n-region 201a forming each photodiode or with each pixel separation structure 160 with high precision. As is apparent from the structure illustrated in FIG. 9, the pixel separation structure 160 opens through the light incidence face of the silicon substrate 150. Accordingly, an alignment mark having the same cross-section structure as the pixel separation structure 160 is formed, and lithography processing is performed based on the mark. In this manner, high alignment precision can be achieved. It is difficult to optically detect a conventional high-density $p^+$-pixel separation structure, and therefore, an alignment mark is formed with some other structure located on a surface on the wiring side. It is also difficult to recognize this alignment mark through an optically non-transparent silicon substrate in visible light or light of shorter wavelengths. At the same time, the alignment precision becomes poorer. It is also possible to perform the alignment with infrared rays of 1.1 μm or higher in wavelength with which the silicon substrate become transparent, but the alignment precision still becomes poorer. To absorb the decrease in the alignment precision, the width of each light shield is made greater in a conventional structure, so as to realize a stable light shield structure.

However, with the improved alignment precision in the structure of this embodiment, the aperture of each photodiode can be made larger, without an unnecessary increase in the width of each optical shield. Accordingly, higher sensitivity can be achieved.

Further, in a conventional back-illuminated solid-state imaging device, depth and fineness cannot be secured for each pixel separation structure at the same time. Also, to prevent an increase in optical crosstalk, the thickness of the silicon substrate or the depth of each photodiode that absorbs incident light is limited to approximately 2.5 microns or 3 microns. With the structure of this embodiment, however, those problems are eliminated. Accordingly, a larger amount of infrared rays that cannot be sufficiently absorbed in a conventional structure can be absorbed, and higher sensitivity can be achieved.

In this embodiment, each pixel separation structure 160 can be formed to extend from the wiring side surface, and a structure that includes the fixed charge film on the surface of the silicon substrate 150 on the light incidence side can be formed to extend from the back face side. However, to simplify the manufacturing procedures and lower the production costs involved in the manufacturing procedures, it is preferable to form those structures at the same time.

Fourth Embodiment

Figure 10:
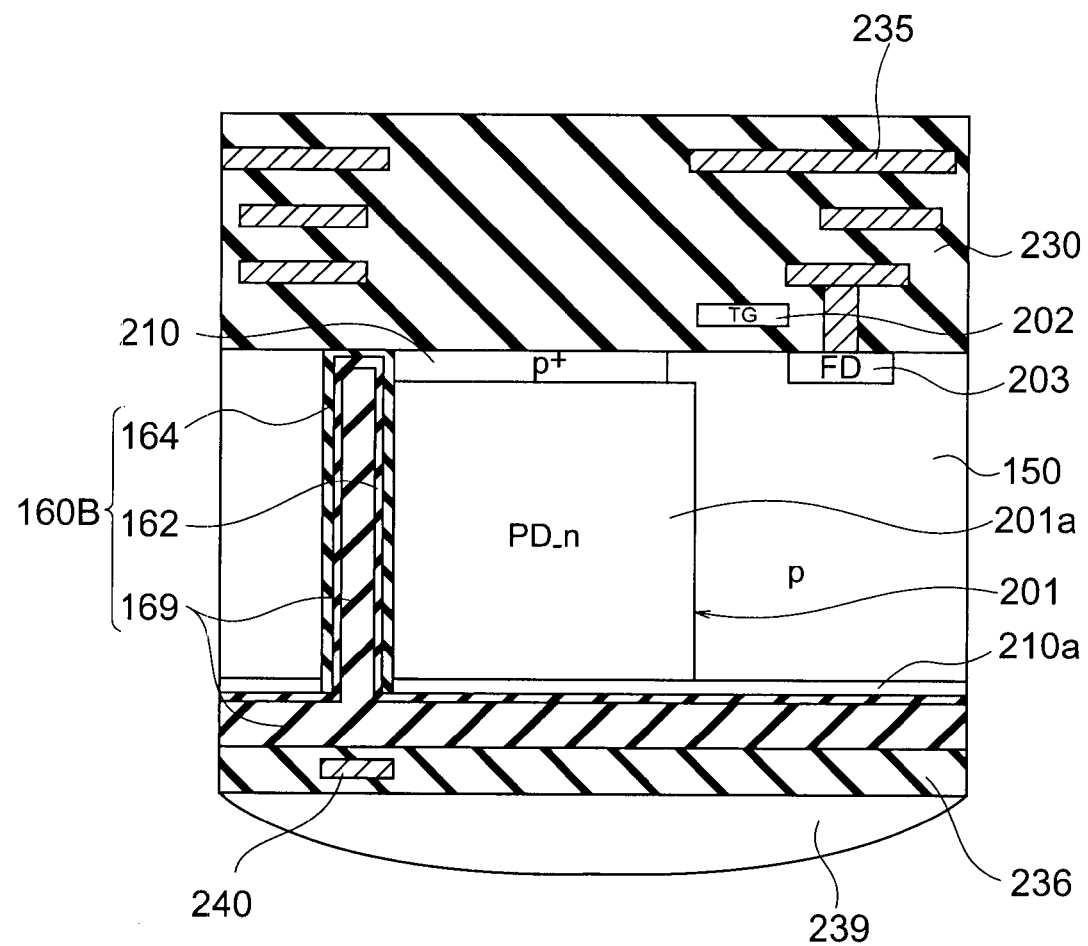
FIG. 10 is a cross-sectional view of a solid-state imaging device according to a fourth embodiment.

FIG. 10 shows a solid-state imaging device according to a fourth embodiment. The solid-state imaging device of the fourth embodiment is the same as the solid-state imaging device of the third embodiment illustrated in FIG. 9, except that the trench-type pixel separation structure 160 is replaced with a trench-type pixel separation structure 160B.

This pixel separation structure 160B has a structure in which a silicon oxide layer 164, a fixed charge film 162, and a film 169 made of a low refractive index material are buried in a trench formed in a silicon substrate. The manufacturing procedures for obtaining the pixel separation structure 160B according to the fourth embodiment are the same as those of the third embodiment, except that the low refractive index film 169 is buried after the silicon oxide layer 164 and the fixed charge film 162 made of hafnium oxide are buried during the process to fill the inside of the pixel separation structure 160B.

The low refractive index material here means a material having a lower refractive index than that of the semiconductor substrate 150. Where the semiconductor substrate 150 is made of single-crystal silicon, its refractive index is 3.9. Therefore, the low refractive index material is a material having a lower refractive index than 3.9. Alternatively, as described in the third embodiment, the low refractive index material should preferably be a material having a lower refractive index than the refractive index of hafnium oxide, which is 2.0, so as to improve the efficiency of the antireflection structure on the light incidence side and achieve higher sensitivity. Further, to improve the effect to reduce optical crosstalk, it is more preferable to use a material having a lower refractive index than 1.4, which is the refractive index of silicon oxide.

According to this embodiment, the effect to reduce optical crosstalk caused by obliquely incident light entering adjacent pixels is improved, and a solid-state imaging device with higher sensitivity can be obtained. The reason for that is as follows.

Optical crosstalk is reduced by each pixel separation structure as described above, and obliquely incident light is total-reflected by a structure that is filled with a material having a lower refractive index than 3.9, which is the refractive index of the single-crystal silicon of the semiconductor substrate.

At this point, to reduce optical crosstalk, it is essential to make the critical angle θc for total reflection smaller. According to the above described equation (1) that defines the critical angle, the refractive index $n_2$ of the exit-side material needs to be lower than the refractive index $n_1$ of the incidence-side material. In other words, it is necessary to use a material having a lower refractive index than the refractive index $n_1$ (=3.9) of the single-crystal silicon.

The interface that faces obliquely incident light first is the interface between the single-crystal silicon having a refractive index of 3.9 and the silicon oxide layer having a refractive index of 1.4, and the critical angle at this point is 21 degrees. Accordingly, obliquely incident light that enters the solid-state imaging device at an incident angle of 69 degrees or smaller is total-reflected by this interface, and occurrences of optical crosstalk are restrained. In reality, the behavior of obliquely incident light entering the pixel separation structure 160 designed to have a smaller size than the wavelength range (400 nm through 700 nm) of incident light is complicated due to influence of its wave nature, and the obliquely incident light might seep through the thin silicon oxide layer 164. In such a case, the critical angle is determined by the relationship in refractive index between the hafnium oxide film 162 having a higher refractive index than the silicon oxide layer 164 and the single-crystal silicon. As a result, the critical angle becomes as large as 30 degrees.

To avoid the influence of the seeping due to the wave nature of incident light, the hafnium oxide film 162 is designed to have a smaller film thickness than the film thickness necessary for filling the inside of the trench, and the trench is then filled with a low refractive index material. In this manner, an increase of the critical angle can be prevented, and the range of the reduction of optical crosstalk can be widened.

For example, the trench is filled with a silicon oxide layer after the formation of a hafnium oxide film of such a film thickness that cannot fill the trench. By doing so, a critical angle of 21 degrees can be maintained, and the critical angle can be made even smaller by forming a so-called low-k film (a low dielectric constant material film) having an even lower refractive index. The material of the low-k film having a low refractive index may be silicon oxide, porous silica, a polymeric material, or the like.

This embodiment can achieve not only the effect to reduce optical crosstalk but also the effect to lower the production costs through the shortening of the manufacturing time.

The film formation of a hafnium oxide film as a fixed charge film is performed through procedures according to ALD or the like, as described above. Since the hafnium oxide film is conformally formed inside a trench structure having a high aspect ratio, the throughput of the manufacturing process is low. However, as described above, fixed charges are eccentrically located in the interface between the hafnium oxide film and the silicon oxide layer. Therefore, even if the film thickness of the hafnium oxide film is small, it is possible to achieve the effect to retain fixed charges. Accordingly, by filling the trench with a low refractive index material following a thin hafnium oxide film in a high-throughput procedure, the structure of this embodiment can be realized.

The low refractive index material may be any of various kinds of coating films other than a silicon oxide film. In that case, a great effect to increase the throughput is achieved, and the production costs can be remarkably lowered.

Fifth Embodiment

Figure 11:
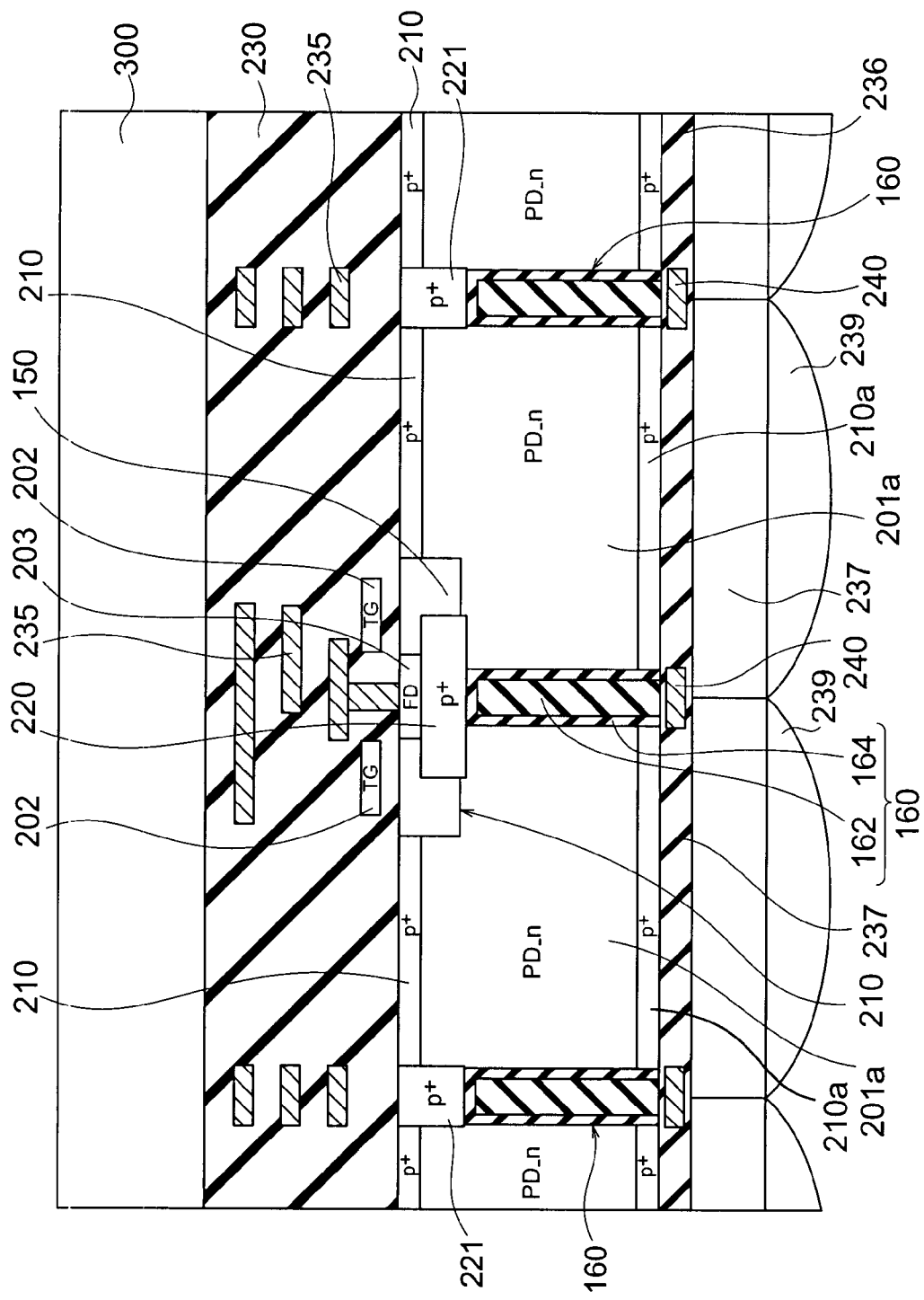
FIG. 11 is a cross-sectional view of a solid-state imaging device according to a fifth embodiment.

FIG. 11 shows a solid-state imaging device according to a fifth embodiment. In the solid-state imaging device of the fifth embodiment, each trench-type pixel separation structure 160 is provided between adjacent pixels, and each $p^+$-pixel separation region 220 is provided between a floating diffusion layer 203 and the pixel separation structure 160 on the side on which the floating diffusion layer 203 is provided between adjacent pixels, as in the third embodiment. Also, each $p^+$-pixel separation region 221 is provided on a different side from the side on which the floating diffusion layer 203 is provided between the adjacent pixels. In the fifth embodiment, each pixel separation structure 160 has a structure in which a silicon oxide layer 164 and a fixed charge film 162 containing hafnium oxide, for example, are buried in a trench formed in a semiconductor substrate 150, as described with reference to FIG. 3.

In the fifth embodiment, the supporting substrate 300 described in relation to the method for manufacturing the solid-state imaging device of the third embodiment is provided on the interlayer insulating film 230. This fifth embodiment differs from the third embodiment in that each fixed charge film 162 is not formed on the back face side of the silicon substrate 150, but an insulating film 236 that transmits incident light is provided on the back face side. Color filters 237 are provided on this insulating film 236 (below the insulating film 236 in FIG. 11), and microlenses 239 are provided on the color filters 237 (below the color filters 237 in FIG. 11). In the regions in the insulating film 236 corresponding to the pixel separation structures 160, light shields 240 are provided to overlap with or cover the pixel separation structures 160. A $p^+$-type impurity diffused region 210 for preventing dark current from flowing into a PD_n-region 201a is provided in a region on the front face side of the silicon substrate 150 located between each PD_n-region 201a and the interlayer insulating film 230, and a $p^+$-type impurity diffused region 210a for preventing dark current from flowing into a corresponding PD_n-region 201a is provided in a region on the back face side of the silicon substrate 150 located between each PD_n-region 201a and the insulating film 236. The color filter 237 provided for each pixel is placed so that its color is different from that of the color filter placed on each adjacent pixel. In other words, the fifth embodiment has the same structure as the first modification of the second embodiment, except that the solid-state imaging device is of a back-illuminated type, instead of a front-illuminated type.

According to the fifth embodiment, the pixel-circuit sharing method described in the second embodiment can be implemented. Specifically, in a case where pixels are laid out in a pixel-circuit sharing manner, the two photodiodes sharing one floating diffusion layer 203 are formed by arranging a photodiode 201, a transfer transistor 202, a floating diffusion layer 203, a transfer transistor 202, and a photodiode 201 in this order on the surface of the silicon substrate 150 on the wiring side. Inside the silicon substrate 150, however, a photodiode 201, a $p^+$-pixel separation region 220, and a photodiode 201 are formed and arranged in this order. In this case, each pixel separation structure 160 for separating pixels between two photodiodes 201 is formed and buried inside the silicon substrate 150, and each $p^+$-pixel separation region 220 formed with a high-density $p^+$-type impurity diffused region in contact with the wiring-side end face of each corresponding pixel separation structure 160 is formed. A transfer transistor 202, a floating diffusion layer 203, and a transfer transistor 202 are further formed on the front face side of the silicon substrate 150. Also, each $p^+$-type pixel separation region 221 is formed on a different side from the side on which the corresponding floating diffusion layer 203 is provided between the adjacent pixels. With this arrangement, the solid-state imaging device of this embodiment having the separated structure illustrated in FIG. 11 is obtained.

This embodiment can also reduce electrical crosstalk to a sufficiently low level, like the first modification of the second embodiment. Also, the light leakage from obliquely incident light into adjacent pixels that causes optical crosstalk is also remarkably reduced.

As described above, according to this embodiment, a pixel layout according to the pixel-circuit sharing method can be used, and finer pixels can be obtained. Also, combined with the high sensitivity characteristically provided by the pixel-circuit sharing method, a solid-state imaging device with higher sensitivity can be obtained.

Sixth Embodiment

Figure 12:
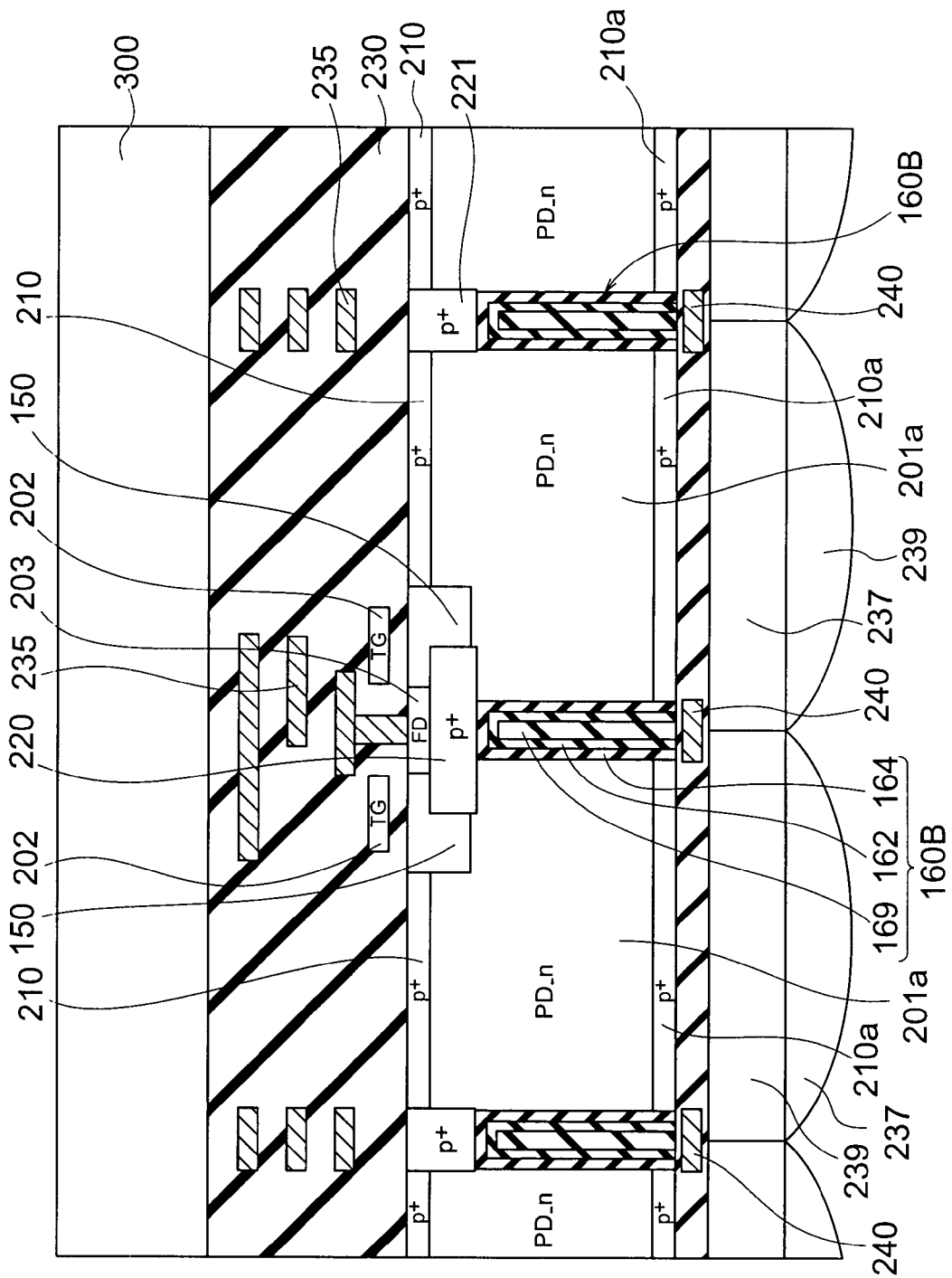
FIG. 12 is a cross-sectional view of a solid-state imaging device according to a sixth embodiment.

FIG. 12 shows a solid-state imaging device according to a sixth embodiment. The solid-state imaging device of the sixth embodiment is the same as the solid-state imaging device of the fifth embodiment illustrated in FIG. 11, except that each pixel separation structure 160 is replaced with the pixel separation structure 160A used in the fourth embodiment illustrated in FIG. 10.

This sixth embodiment can also achieve the same effects as those of the fifth embodiment, and, like the fourth embodiment, can increase the effect to reduce optical crosstalk caused by obliquely incident light entering adjacent pixels. Accordingly, a solid-state imaging device with higher sensitivity can be obtained.

Seventh Embodiment

Figure 13:
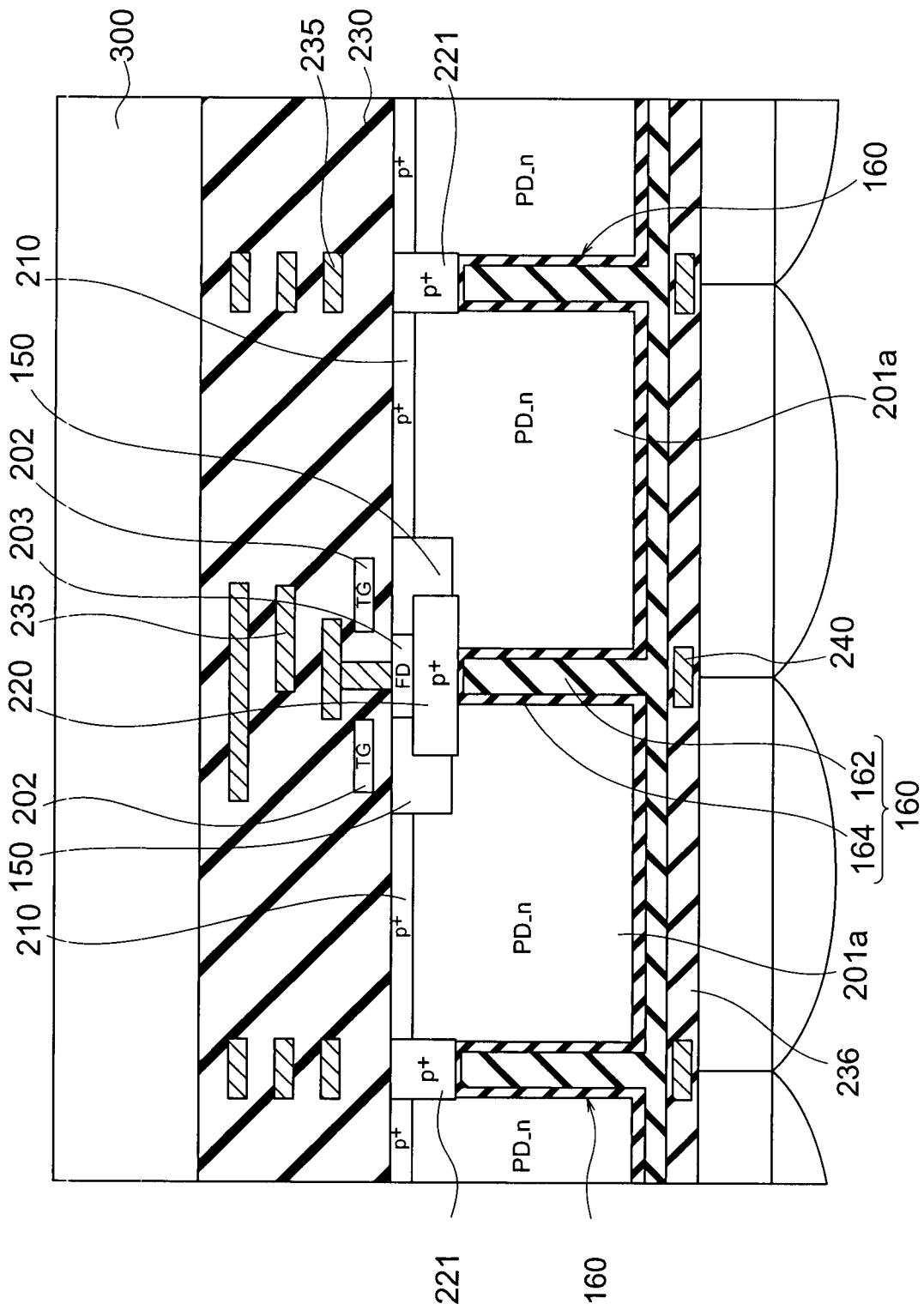
FIG. 13 is a cross-sectional view of a solid-state imaging device according to a seventh embodiment.

FIG. 13 shows a solid-state imaging device according to a seventh embodiment. The solid-state imaging device of the seventh embodiment is the same as the solid-state imaging device of the fifth embodiment illustrated in FIG. 11, except that the fixed charge film 162 and the silicon oxide layer 164 buried in the trench of each pixel separation structure also extend to the lower face side of each corresponding PD_n-region 201a. Unlike the fifth embodiment illustrated in FIG. 11, this embodiment does not involve the $p^+$-regions 210a for preventing dark current from flowing into the PD_n-regions 201a. This is because a constant potential is applied to the fixed charge film 162, to prevent dark current from flowing into the PD_n-regions 201a.

According to this embodiment, the procedure to provide the p$^+$-regions 210a for preventing dark current from flowing into the PD_n-regions 201a can be eliminated. By virtue of the simplification of the manufacturing procedures, the production yield can be improved, and the production costs are lowered. Accordingly, only lower costs are required.

The seventh embodiment can also achieve the same effects as those of the fifth embodiment.

Eighth Embodiment

Figure 14:
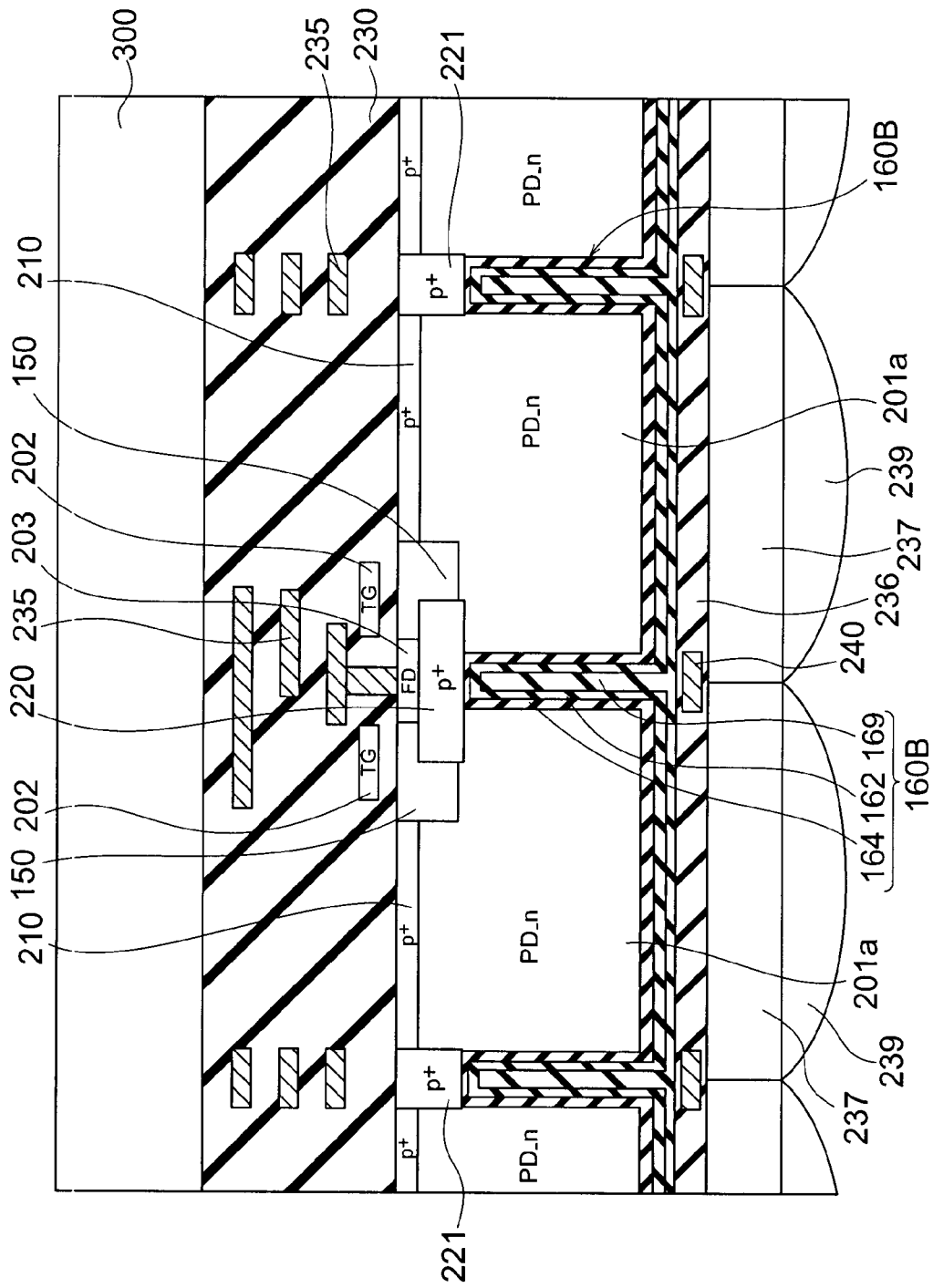
FIG. 14 is a cross-sectional view of a solid-state imaging device according to an eighth embodiment.

FIG. 14 shows a solid-state imaging device according to an eighth embodiment. The solid-state imaging device of the eighth embodiment is the same as the solid-state imaging device of the sixth embodiment illustrated in FIG. 12, except that the fixed charge film 162, the silicon oxide layer 164, and the low refractive index film 169 buried in the trench of each pixel separation structure are designed to also extend on the lower face side of each corresponding PD_n-region 201a. Unlike the sixth embodiment illustrated in FIG. 12, this embodiment does not involve the p$^+$-type impurity diffused regions 210a for preventing dark current from flowing into the PD_n-regions 201a. This is because a constant potential is applied to the fixed charge film 162, to prevent dark current from flowing into the PD_n-regions 201a.

According to this embodiment, the procedure to form the p$^+$-type impurity diffused regions 210a for preventing dark current from flowing into the PD_n-regions 201a can be eliminated, as in the seventh embodiment. By virtue of the simplification of the manufacturing procedures, the production yield is improved, and the production costs are lowered. Accordingly, only lower costs are required.

This eighth embodiment can also achieve the same effects as those of the sixth embodiment.

Ninth Embodiment

Figure 15:
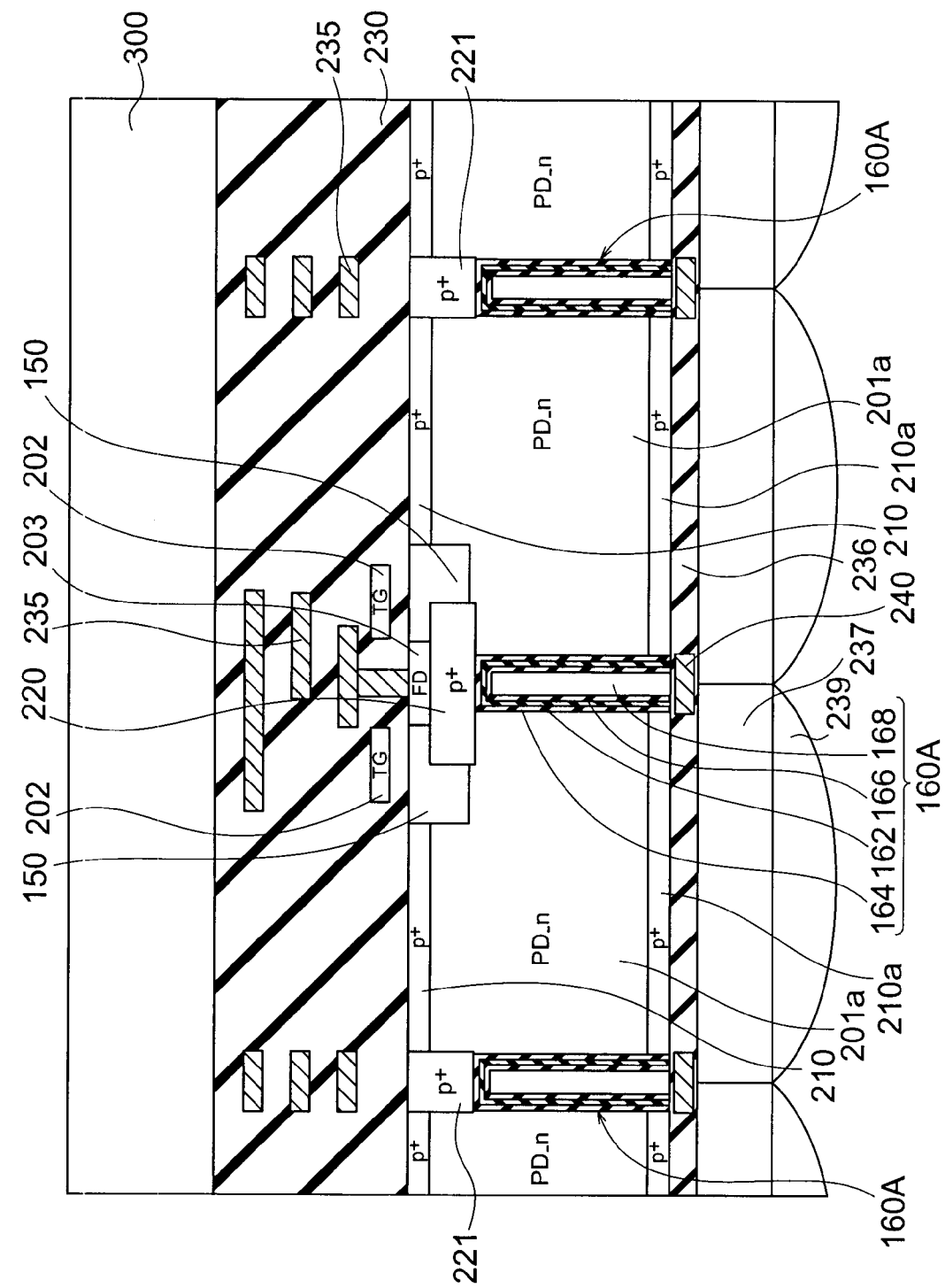
FIG. 15 is a cross-sectional view of a solid-state imaging device according to a ninth embodiment.

FIG. 15 shows a solid-state imaging device according to a ninth embodiment. The solid-state imaging device of the ninth embodiment is the same as the solid-state imaging device of the fifth embodiment illustrated in FIG. 11, except that each pixel separation structure 160 is replaced with the pixel separation structure 160A used in the first modification of the first embodiment illustrated in FIG. 4.

The ninth embodiment can also achieve the same effects as those of the fifth embodiment. Also, as in the case of the first modification of the first embodiment, generation of white scars due to a gate leak can be remarkably reduced.

Tenth Embodiment

Figure 16:
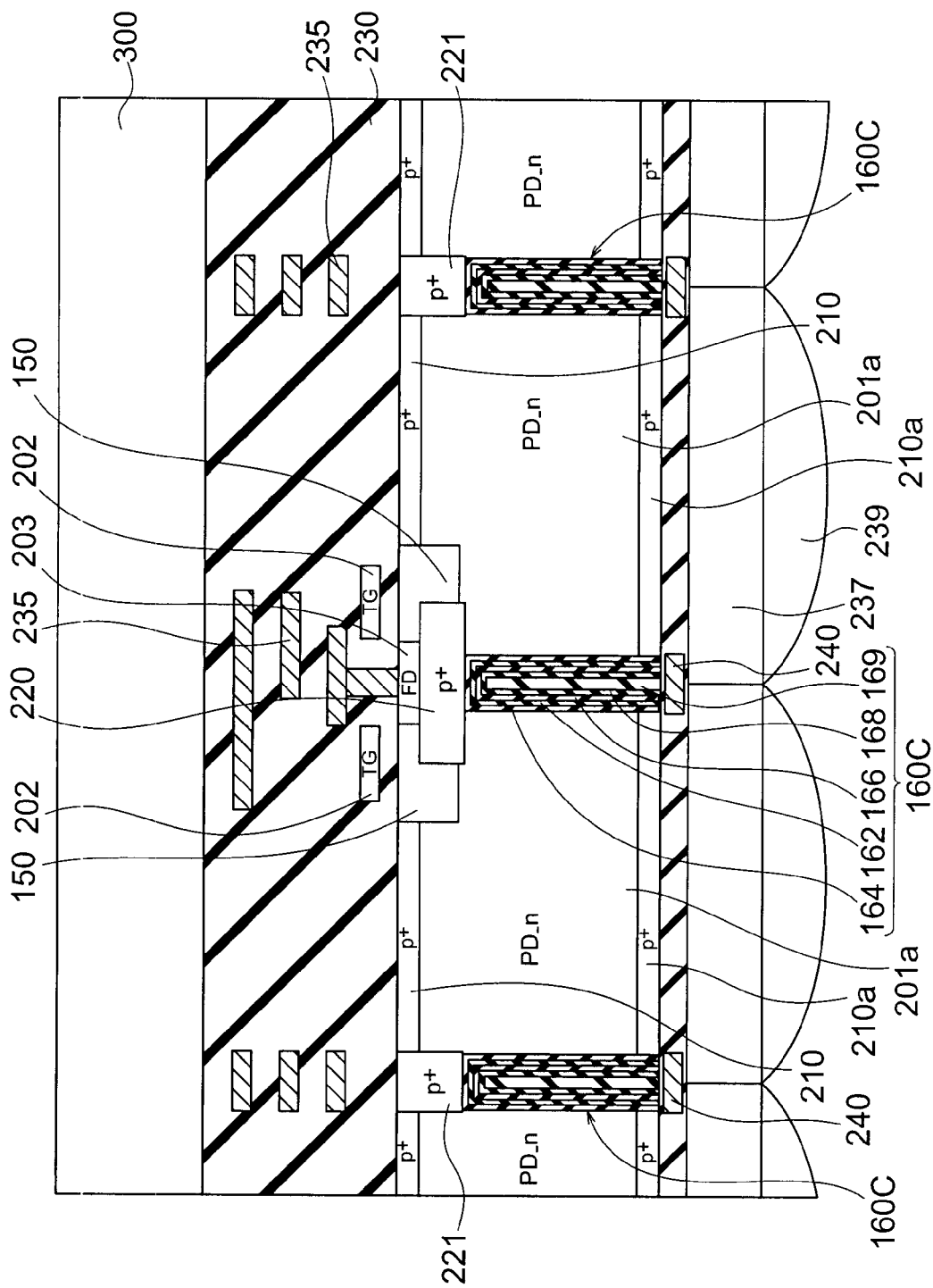
FIG. 16 is a cross-sectional view of a solid-state imaging device according to a tenth embodiment.

FIG. 16 shows a solid-state imaging device according to a tenth embodiment. The solid-state imaging device of the tenth embodiment is the same as the solid-state imaging device of the ninth embodiment illustrated in FIG. 15, except that each pixel separation structure 160A is replaced with a trench-type pixel separation structure 160C. This pixel separation structure 160C further includes a low refractive index material film 169 provided in the polycrystalline silicon film 168 of each pixel separation structure 160A. In other words, the pixel separation structure 160C has a stack film buried in a trench, with the stack film being formed with the silicon oxide layer 164, the fixed charge film 162, the silicon oxide layer 166, the polycrystalline silicon film 168, and the low refractive index material film 169.

The tenth embodiment can also achieve the same effects as those of the ninth embodiment. Also, the effect to reduce optical crosstalk caused by obliquely incident light entering adjacent pixels can be increased, and accordingly, a solid-state imaging device with higher sensitivity can be obtained.

Eleventh Embodiment

Figure 17:
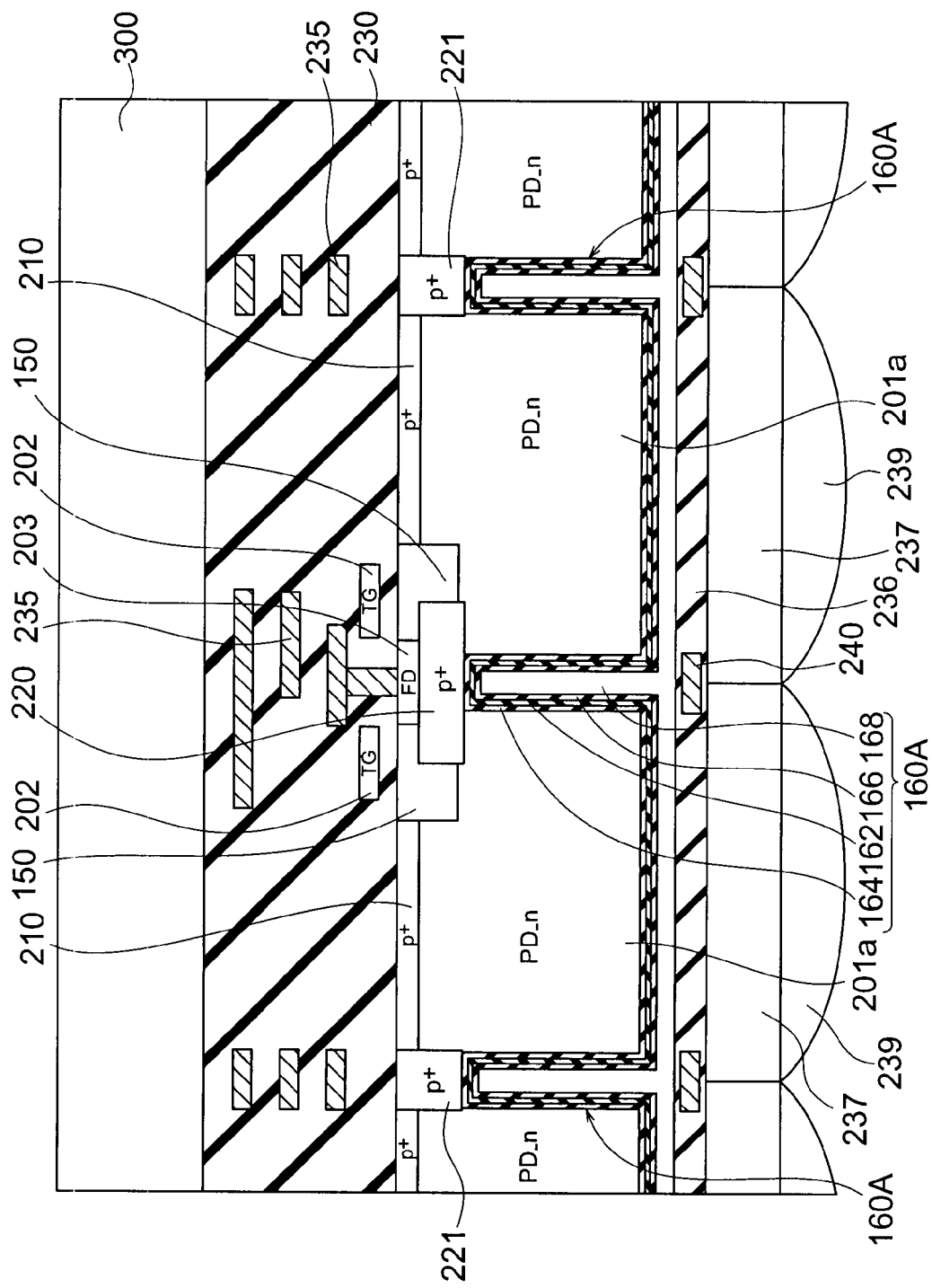
FIG. 17 is a cross-sectional view of a solid-state imaging device according to an eleventh embodiment.

FIG. 17 shows a solid-state imaging device according to an eleventh embodiment. The solid-state imaging device of the eleventh embodiment is the same as the solid-state imaging device of the ninth embodiment illustrated in FIG. 15, except that the silicon oxide layer 164, the fixed charge film 162, the silicon oxide layer 166, and the polycrystalline silicon film 168 buried in the trench of each pixel separation structure 160A are designed to also extend on the lower face side of each corresponding PD_n-region 201a. Unlike the ninth embodiment illustrated in FIG. 15, this embodiment does not involve the p$^+$-type impurity diffused regions 210a for preventing dark current from flowing into the PD_n-regions 201a. This is because a constant potential is applied to the fixed charge film 162, to prevent dark current from flowing into the PD_n-regions 201a.

According to this embodiment, the procedure to form the p$^+$-type impurity diffused regions 210a for preventing dark current from flowing into the PD_n-regions 201a can be eliminated, as in the seventh embodiment. By virtue of the simplification of the manufacturing procedures, the production yield is improved, and the production costs are lowered. Accordingly, only lower costs are required.

This eleventh embodiment can also achieve the same effects as those of the ninth embodiment.

Twelfth Embodiment

Figure 18:
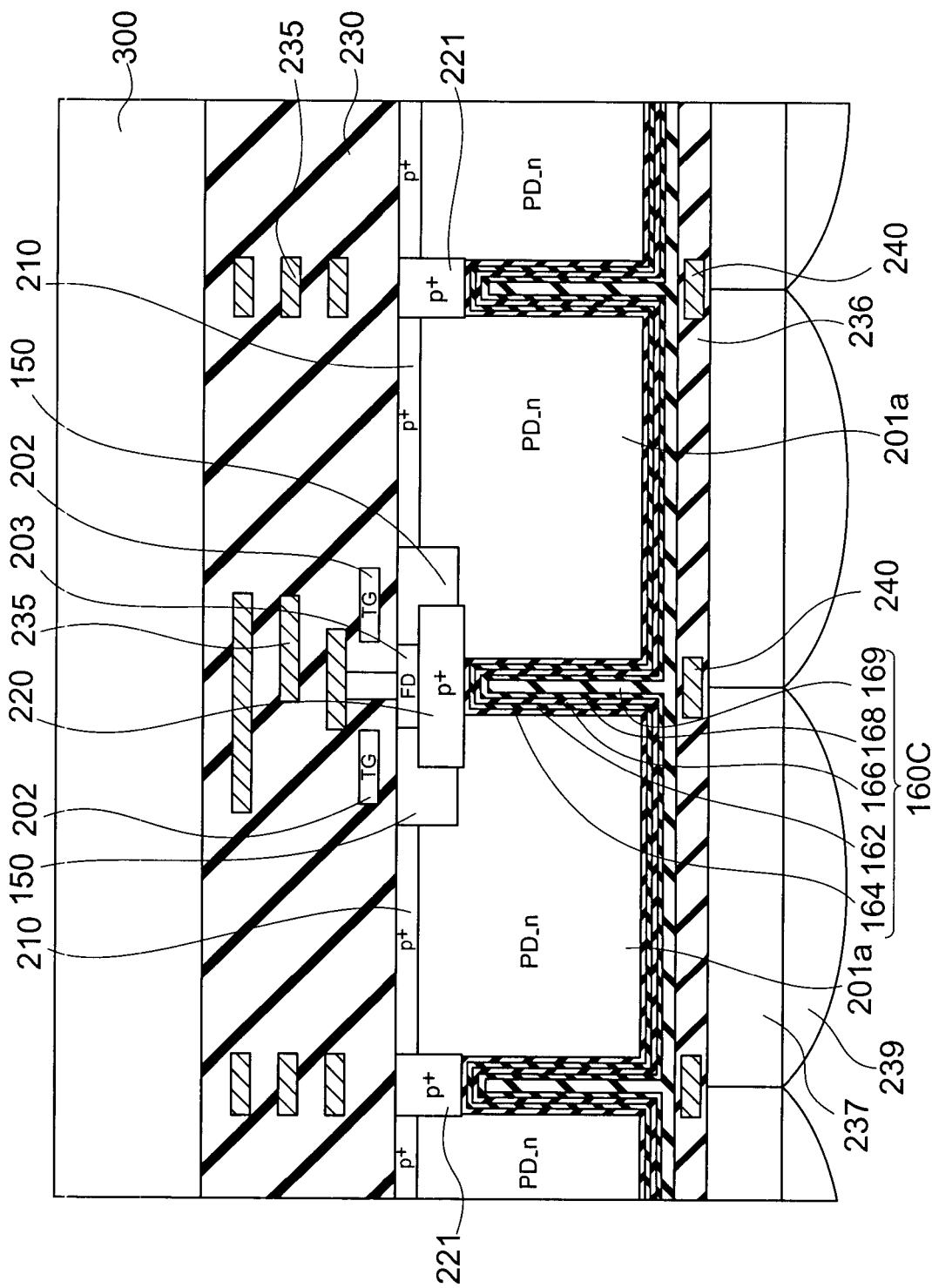
FIG. 18 is a cross-sectional view of a solid-state imaging device according to a twelfth embodiment.

FIG. 18 shows a solid-state imaging device according to a twelfth embodiment. The solid-state imaging device of the twelfth embodiment is the same as the solid-state imaging device of the tenth embodiment illustrated in FIG. 16, except that the silicon oxide layer 164, the fixed charge film 162, the silicon oxide layer 166, the polycrystalline silicon film 168, and the low refractive index material film 169 buried in the trench of each pixel separation structure 160C are designed to also extend on the lower face side of each corresponding PD_n-region 201a. Unlike the tenth embodiment illustrated in FIG. 16, this embodiment does not involve the p$^+$-type impurity diffused regions 210a for preventing dark current from flowing into the PD_n-regions 201a. This is because a constant potential is applied to the fixed charge film 162, to prevent dark current from flowing into the PD_n-regions 201a.

According to this embodiment, the procedure to form the p$^+$-type impurity diffused regions 210a for preventing dark current from flowing into the PD_n-regions 201a can be eliminated, as in the seventh embodiment. By virtue of the simplification of the manufacturing procedures, the production yield is improved, and the production costs are lowered. Accordingly, only lower costs are required.

This twelfth embodiment can also achieve the same effects as those of the tenth embodiment.

In each of the back-illuminated solid-state imaging devices according to the ninth through twelfth embodiments, a polycrystalline silicon film existing on the light incidence side might absorb incident light and lower the sensitivity. However, this polycrystalline silicon film is a structure that needs to be operated only when electrons are injected into a silicon nitride film in the process to initialize fixed charges, and is not necessarily required to have low resistance. Therefore, to avoid the problem of a decrease in sensitivity due to light absorption, the polycrystalline silicon film can be made thinner. For example, in a buried photodiode structure in a conventional front-illuminated solid-state imaging device, the invalid region that does not contribute to the sensitivity of the photodiodes normally has a greater depth than 0.1 µm, and in the circumstances, it is difficult to make the film thinner for reasons related to the thermal process or a reduction in surface component noise.

Therefore, where the film thickness of the polycrystalline silicon film as a fixed charge film is adjusted to 0.1 µm or smaller, only a decrease in sensitivity that is almost the same as the decrease in sensitivity observed in a conventional buried photodiode is caused. On the other hand, the thickness of the polycrystalline silicon layer can be adjusted to approximately 100 nm, and accordingly, it is safe to say that even higher sensitivity than that of a buried photodiode can be achieved.

As described above, according to each embodiment, even in miniaturized pixels, interfacial shield charges of the opposite conductivity type of signal charges are induced in the vicinity of the pixel separation region of each photodiode by each fixed charge film that retains fixed charges and is buried in a trench structure. Accordingly, generation of dark current can be restrained, and pixel separation structures that do not compress the volumes of photodiodes are realized. Thus, a highly sensitive solid-state imaging device can be obtained.

Also, obliquely incident light entering each pixel separation structure is reflected by the incidence face. Accordingly, the obliquely incident light does not enter adjacent pixels, and optical crosstalk can be reduced. Thus, a highly sensitive solid-state imaging device can be obtained.

Further, pixel separation structures and photodiodes each having such a depth as to absorb a sufficient amount of incident light of "red" or long wavelengths can be realized. Accordingly, the red sensitivity is improved, and electrical crosstalk is reduced. Thus, a highly sensitive solid-state imaging device can be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and sprit of the invention.

What is claimed is:

1. A solid-state imaging device comprising:
a semiconductor substrate of a first conductivity type, including a first face, a second face being opposite to the first face, and a trench extending from the first face into the semiconductor substrate;
a plurality of pixels provided in the semiconductor substrate, each of the pixels having a semiconductor region of a second conductivity type that converts incident light from the first face of the semiconductor substrate into signal charges and stores the signal charges;
a readout circuit provided on a side of the second face of the semiconductor substrate, and reading out the signal charges stored in the pixels; and
a pixel separation structure provided between adjacent ones of the pixels in the semiconductor substrate, the pixel separation structure including a stack film that is buried in the trench in the semiconductor substrate, the stack film including a first insulating film provided along side faces and a bottom face of the trench, and a fixed charge film provided in the trench to cover the first insulating film and retains fixed charges that are non-signal charges;
wherein
the semiconductor substrate is a silicon substrate,
the first insulating film is a silicon oxide film, and
the fixed charge film is an oxide dielectric film containing at least one of hafnium (Hf), zirconium (Zr), and titanium (Ti).

2. The device according to claim 1, further comprising
an impurity region of the first conductivity type that is provided in the semiconductor substrate to be in contact with a bottom face of the pixel separation structure, and has a higher density than the semiconductor substrate.

3. The device according to claim 1, wherein
the stack film of the pixel separation structure further includes a second insulating film provided in the trench to cover the fixed charge film, and a polycrystalline silicon electrode film provided in the trench to cover the second insulating film and having a voltage applied thereto.

4. The device according to claim 1, wherein
the stack film of the pixel separation structure further includes a low refractive index film provided in the trench to cover the fixed charge film and having a lower refractive index than the semiconductor substrate.

5. The device according to claim 1, wherein the stack film of the pixel separation structure extends to a light incidence face side of each of the pixels.

6. A solid-state imaging device comprising:
a semiconductor substrate of a first conductivity type, including a first face, a second face being opposite to the first face, and a trench extending from the first face into the semiconductor substrate;
a plurality of pixels provided in the semiconductor substrate, each of the pixels having a semiconductor region of a second conductivity type that converts incident light from a side of the first face of the semiconductor substrate into signal charges and stores the signal charges;
a readout circuit provided on the side of the first face of the semiconductor substrate, and reading out the signal charges stored in the pixels; and
a pixel separation structure provided between adjacent ones of the pixels in the semiconductor substrate, the pixel separation structure including a stack film that is buried in the trench in the semiconductor substrate, the stack film including a first insulating film provided along side faces and a bottom face of the trench, and a fixed charge film provided in the trench to cover the first insulating film and retaining fixed charges that are non-signal charges;
wherein
the semiconductor substrate is a silicon substrate,
the first insulating film is a silicon oxide film, and
the fixed charge film is an oxide dielectric film containing at least one of hafnium (Hf), zirconium (Zr), and titanium (Ti).

7. The device according to claim 6, further comprising
an impurity region of the first conductivity type that is provided in the semiconductor substrate to be in contact with an upper face of the pixel separation structure, and has a higher density than the semiconductor substrate.

8. The device according to claim 6, wherein
the stack film of the pixel separation structure further includes a second insulating film provided in the trench to cover the fixed charge film, and a polycrystalline silicon electrode film provided in the trench to cover the second insulating film and having a voltage applied thereto.

9. The device according to claim 6, wherein
the stack film of the pixel separation structure further includes a low refractive index film provided in the trench to cover the fixed charge film and having a lower refractive index than the semiconductor substrate.

* * * * *